(12) United States Patent
Park

(10) Patent No.: US 11,513,553 B2
(45) Date of Patent: Nov. 29, 2022

(54) PHASE DETECTION CIRCUIT, CLOCK GENERATION CIRCUIT AND SEMICONDUCTOR APPARATUS USING THE PHASE DETECTION CIRCUIT

(71) Applicant: SK hynix Inc., Icheon-si Gyeonggi-do (KR)

(72) Inventor: Gyu Tae Park, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 306 days.

(21) Appl. No.: 16/705,512

(22) Filed: Dec. 6, 2019

(65) Prior Publication Data

US 2020/0401180 A1    Dec. 24, 2020

(30) Foreign Application Priority Data

Jun. 21, 2019 (KR) .................. 10-2019-0074042

(51) Int. Cl.
*G11C 7/22* (2006.01)
*G06F 1/10* (2006.01)
*G06F 1/12* (2006.01)
*H03K 5/24* (2006.01)
*G06F 1/06* (2006.01)
*G11C 11/4076* (2006.01)

(52) U.S. Cl.
CPC .............. *G06F 1/10* (2013.01); *G06F 1/06* (2013.01); *G06F 1/12* (2013.01); *G11C 7/222* (2013.01); *G11C 11/4076* (2013.01); *H03K 5/24* (2013.01)

(58) Field of Classification Search
CPC ....... G11C 11/4076; G11C 7/22; G11C 7/222; G06F 1/10; G06F 1/06; G06F 1/12
See application file for complete search history.

(56) References Cited

U.S. PATENT DOCUMENTS 7,777,543 B2  8/2010 Park
2016/0182060 A1* 6/2016 Im ..................... H03K 5/1565
                                                                    327/158

FOREIGN PATENT DOCUMENTS

KR   1020160076197 A   6/2016
KR   1020200121522 A   10/2020

* cited by examiner

*Primary Examiner* — Alfredo Bermudez Lozada
(74) *Attorney, Agent, or Firm* — William Park & Associates Ltd.

(57) ABSTRACT

A phase detection circuit may include an edge trigger circuit, a strobe generation circuit and a phase detector. The edge trigger circuit generates a falling clock signal and a rising clock signal based on a reference clock signal and a target clock signal. The strobe generation circuit generates a falling strobe signal and a rising strobe signal having pulse widths varying based on a phase relationship between the reference clock signal and the target clock signal. The phase detector generates a phase detection signal based on the falling clock signal, the rising clock signal, the falling strobe signal and the rising strobe signal.

30 Claims, 20 Drawing Sheets

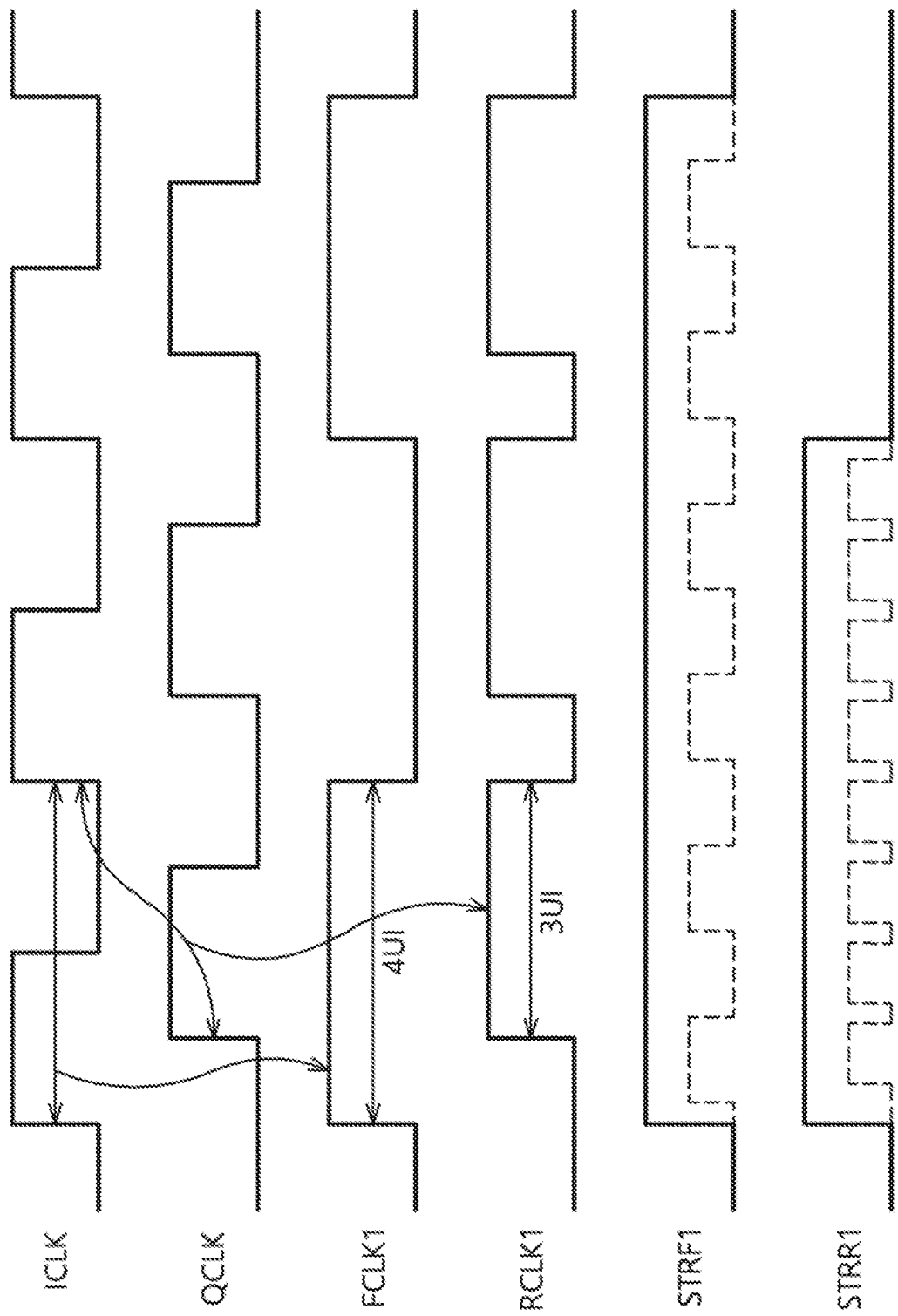

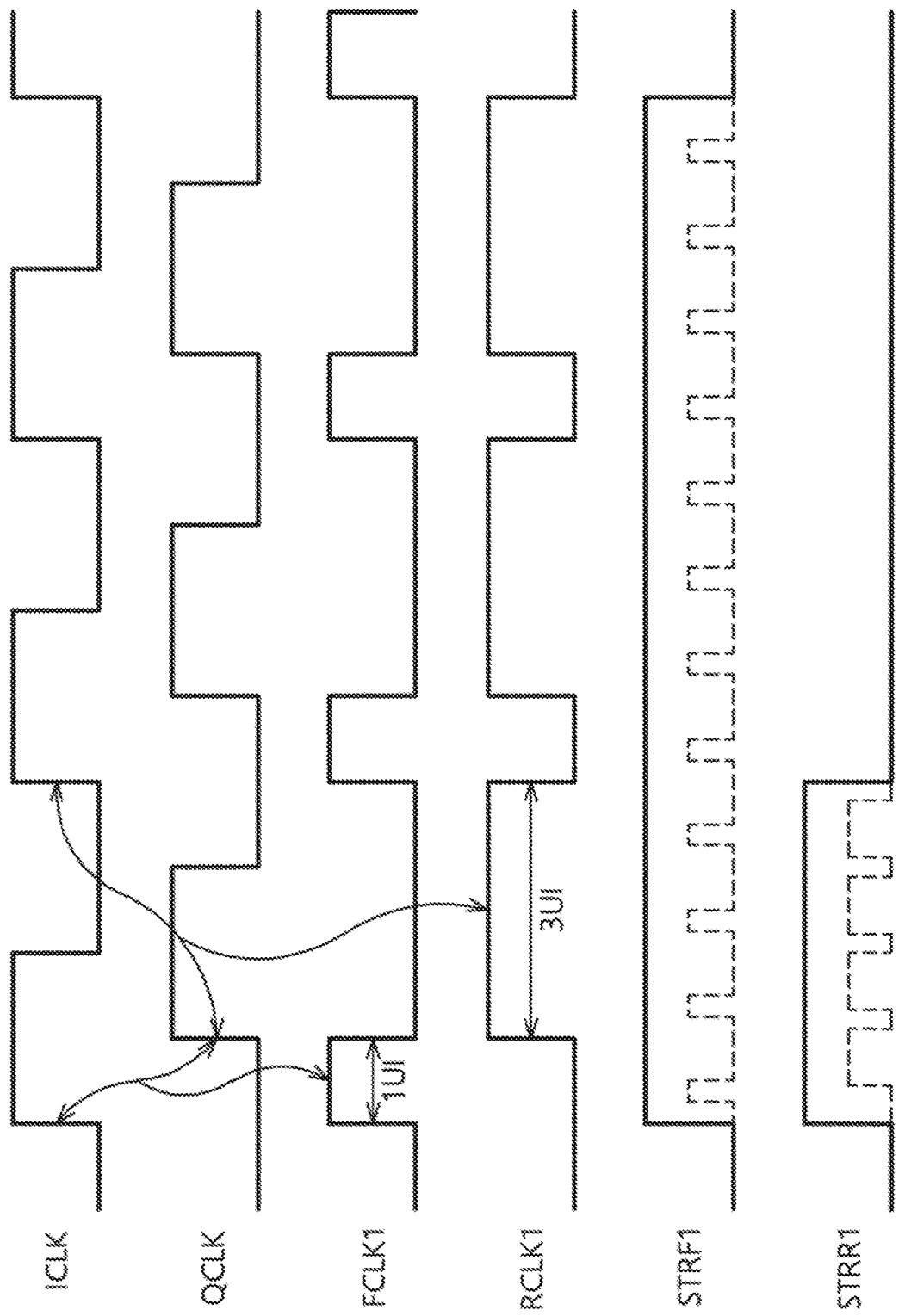

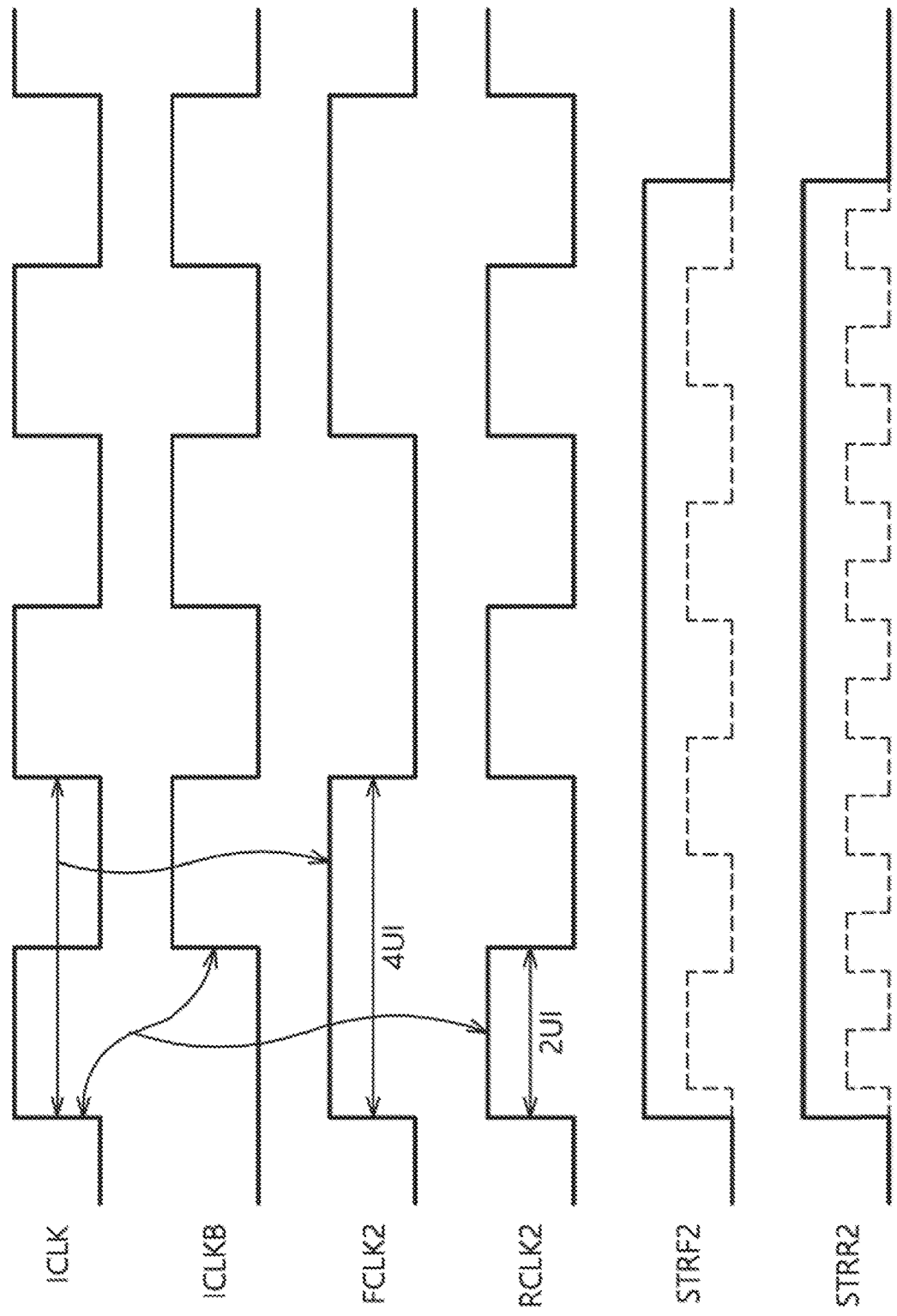

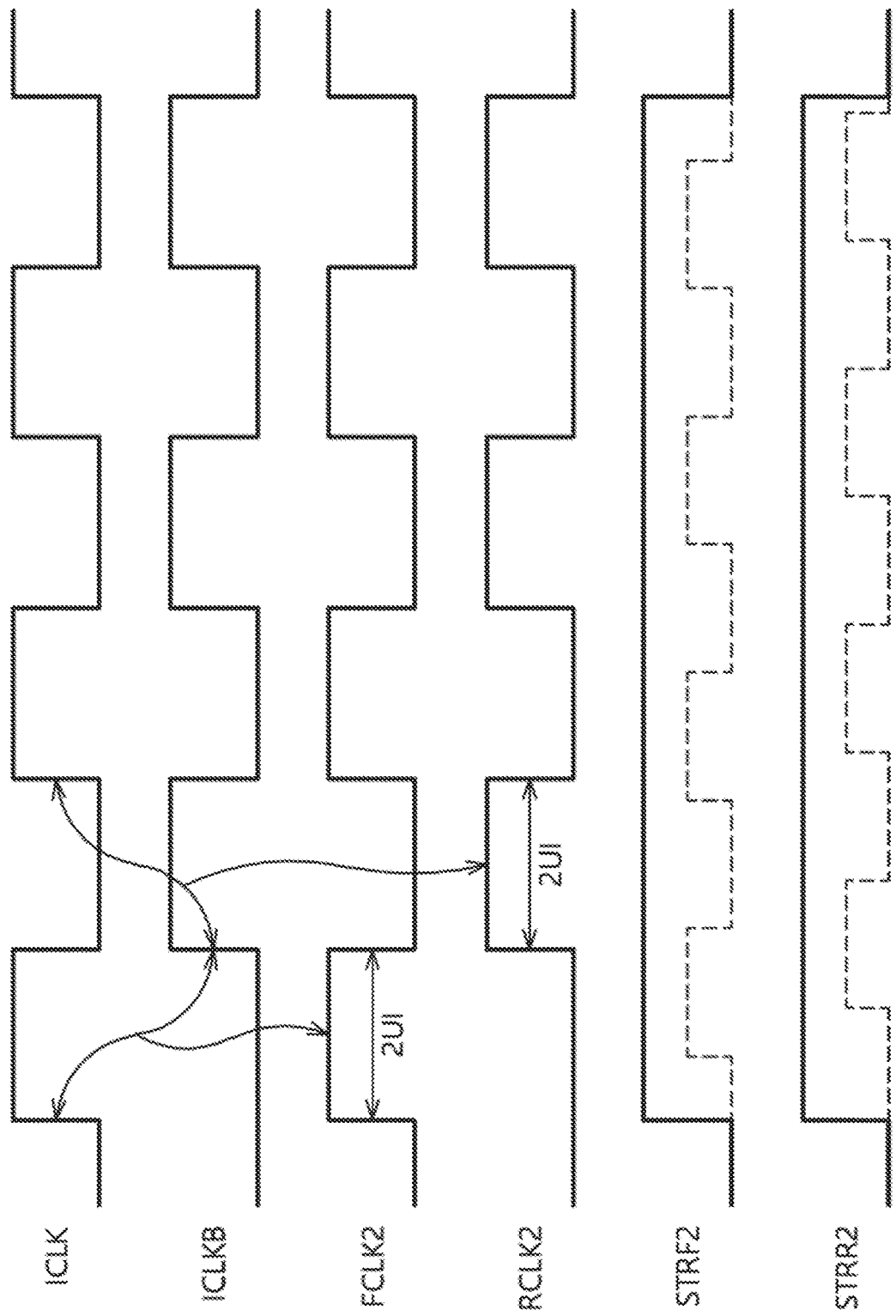

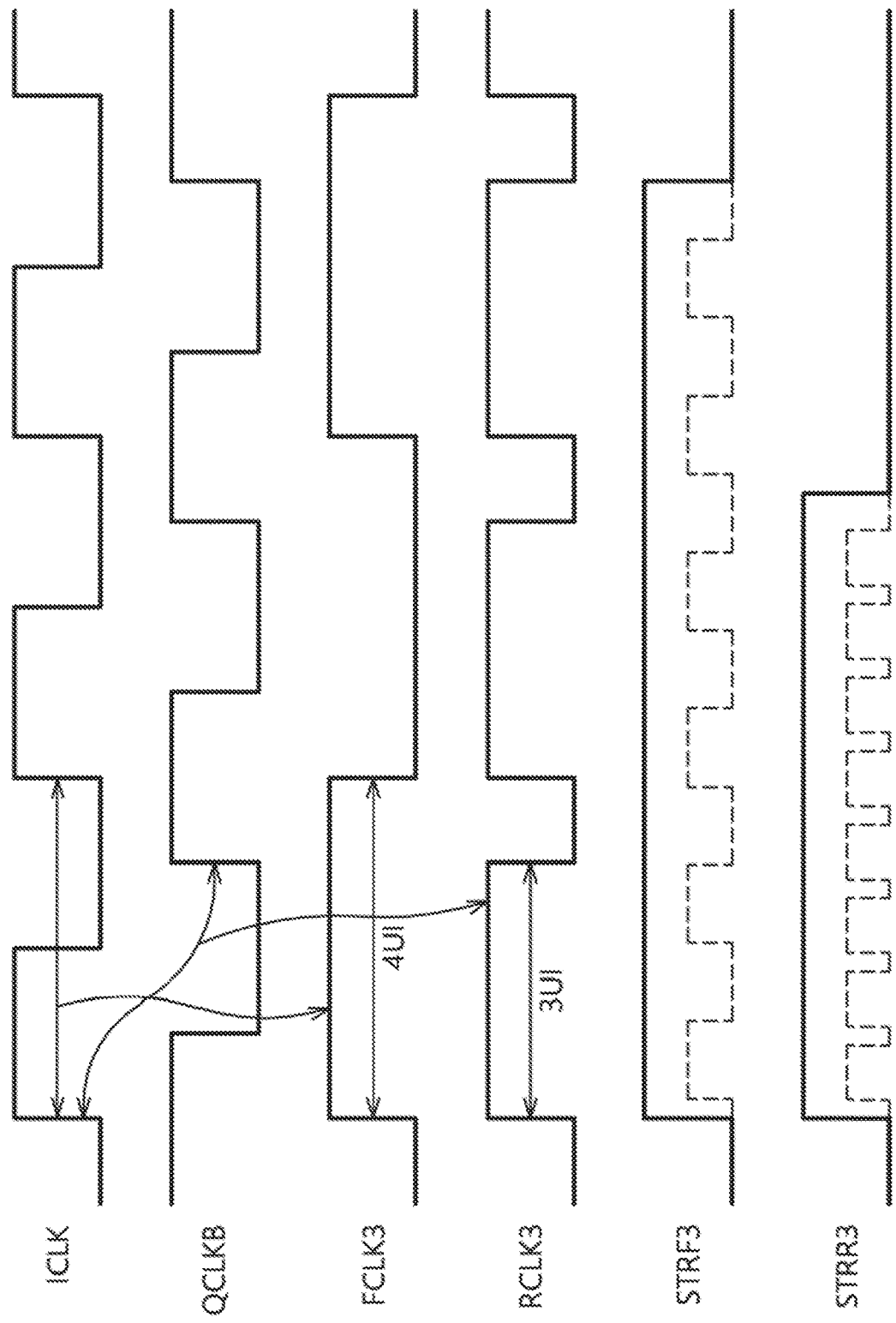

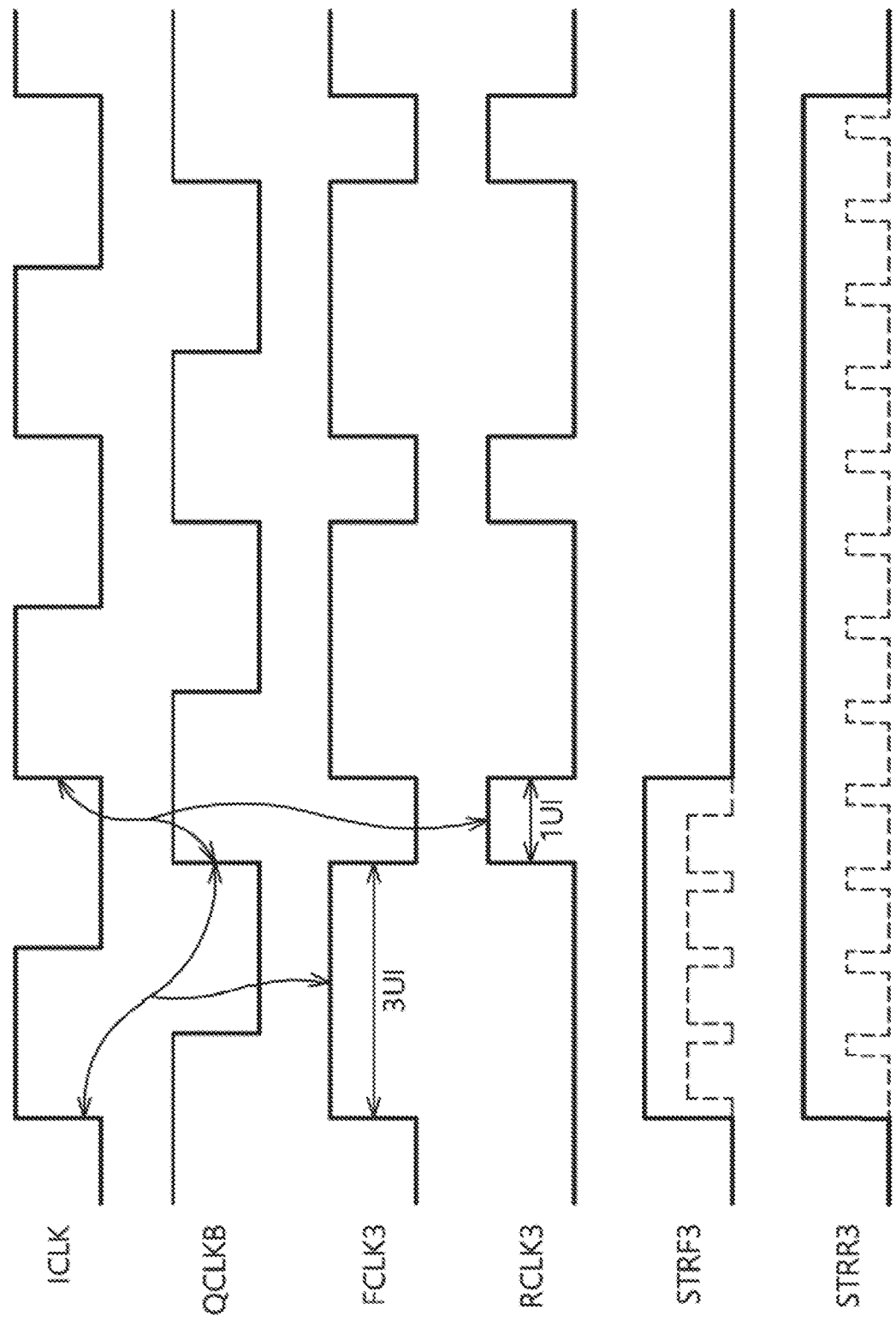

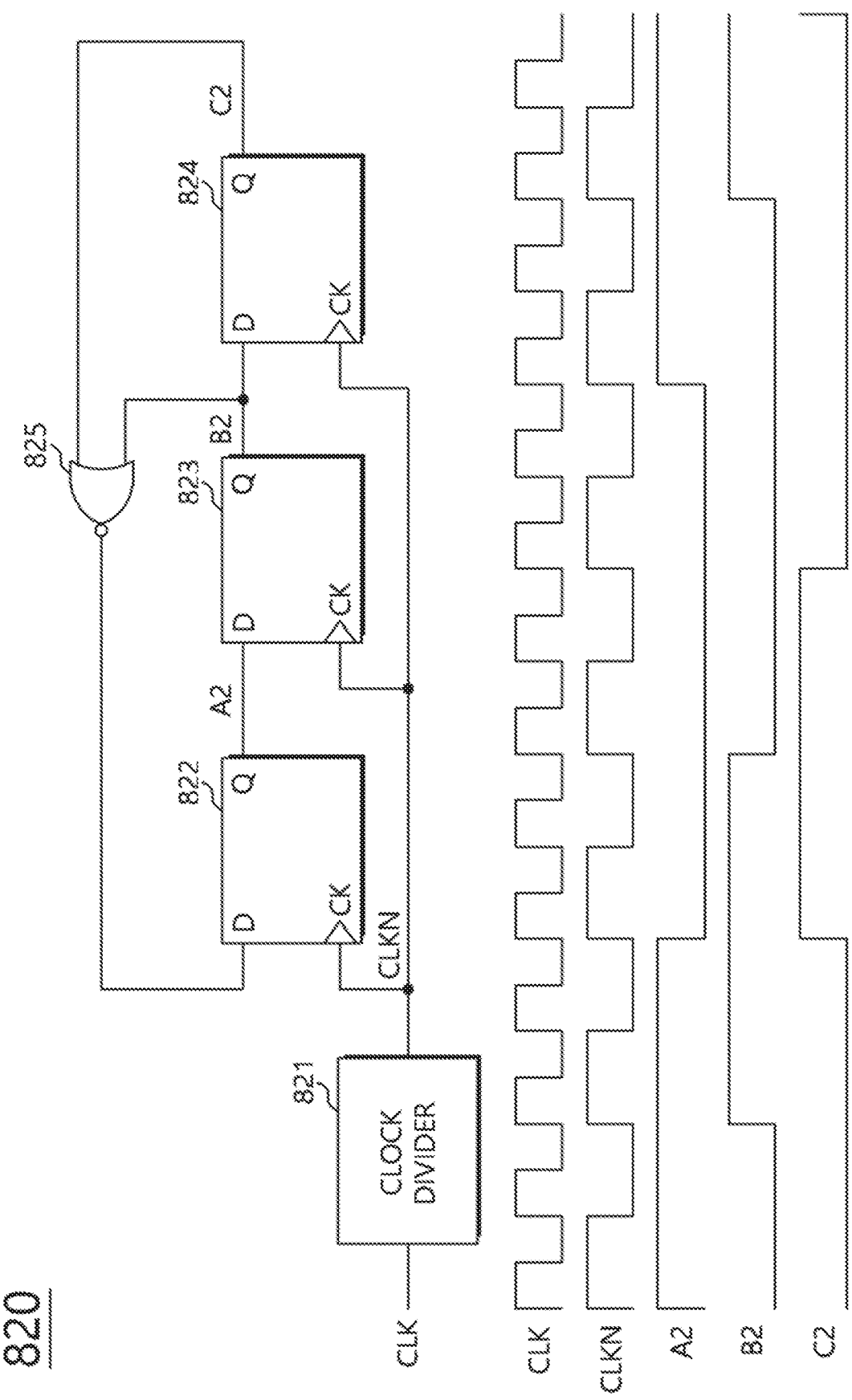

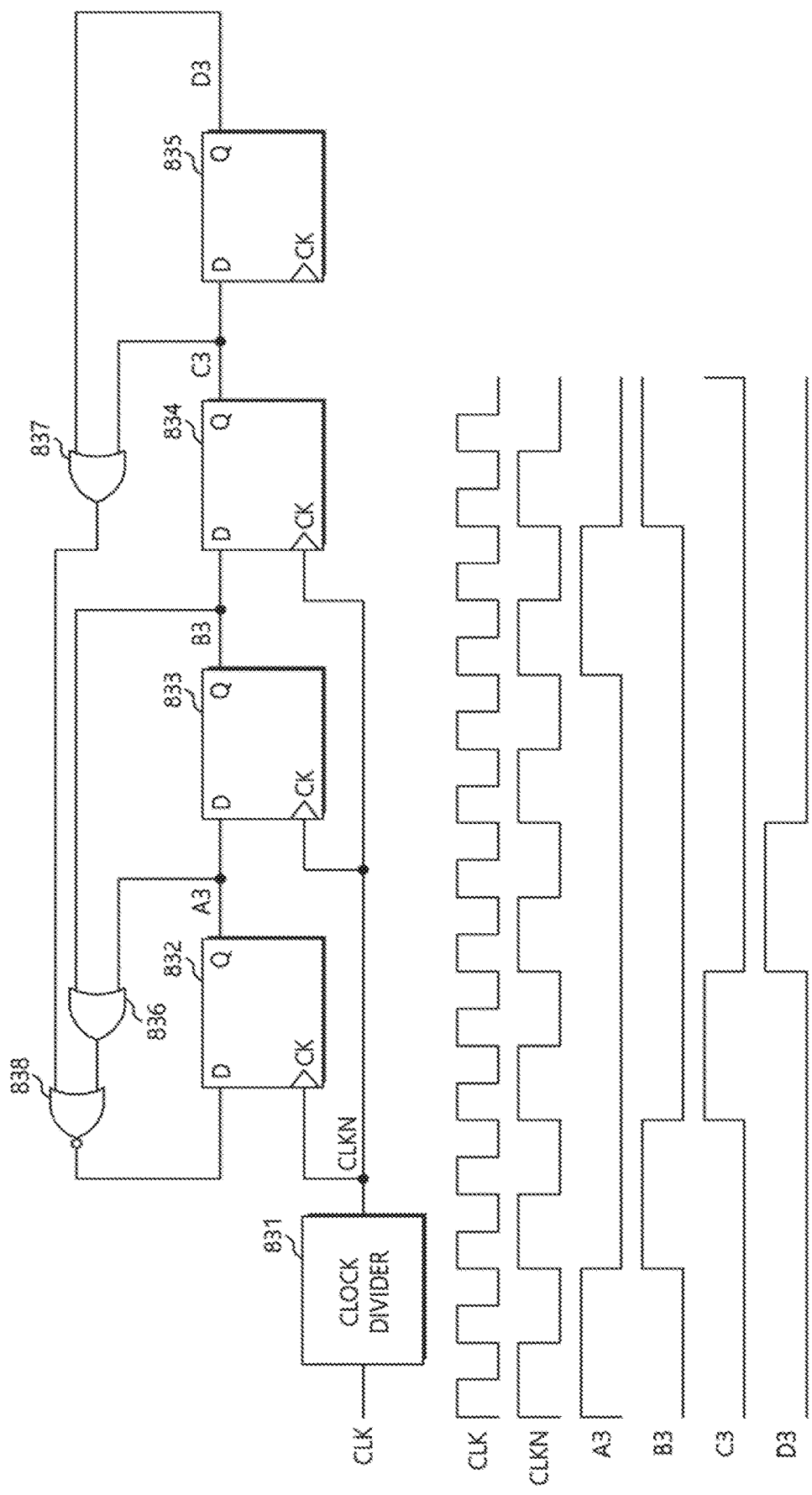

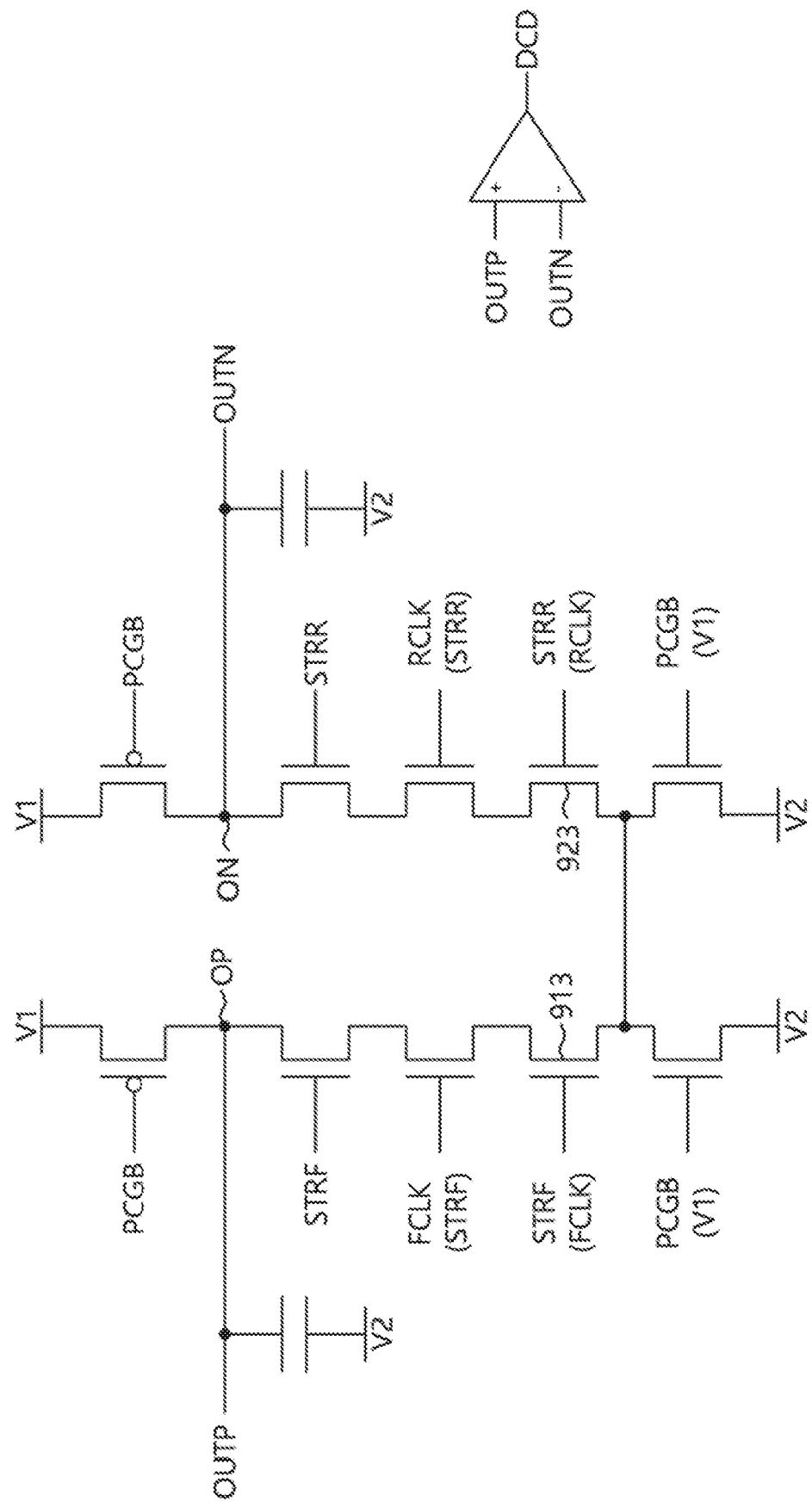

PHASE DETECTION CIRCUIT, CLOCK GENERATION CIRCUIT AND SEMICONDUCTOR APPARATUS USING THE PHASE DETECTION CIRCUIT

CROSS-REFERENCES TO RELATED APPLICATION

The present application claims priority under 35 U.S.C. § 119(a) to Korean application number 10-2019-0074042, filed on Jun. 21, 2019, in the Korean Intellectual Property Office, which is incorporated herein by reference in its entirety.

BACKGROUND

1. Technical Field

Various embodiments generally relate to an integrated circuit technology and, more particularly, to a clock generation circuit is and a semiconductor apparatus.

2. Related Art

An electronic device includes a lot of electronic elements, and a computer system includes lots of semiconductor apparatuses each comprising a semiconductor. Semiconductor apparatuses configuring a computer system may communicate with each other by receiving and transmitting data and a system clock signal such as an external clock signal. The semiconductor apparatuses may operate in synchronization with a clock signal. In order to become in synchronization with an external apparatus or to secure an operation margin, the semiconductor apparatuses may generate an internal clock signal from the system clock signal and may include a clock generation circuit for generating the internal clock signal.

The clock generation circuit may generate the internal clock signal by changing a phase of the system clock signal or by dividing a frequency of the system clock signal. Also, the clock generation circuit may generate a plurality of internal clock signals having different phases from one another. The clock generation circuit may generate the plurality of internal clock signals through a plurality of clock paths. For operation reliability of the semiconductor apparatus, the plurality of internal clock signals should have constant phase differences. However, the plurality of internal clock signals are generated through different clock paths from one another and therefore the plurality of internal clock signals might not have constant phase differences due to skews of the clock paths.

SUMMARY

In an embodiment, a phase detection circuit may include an edge trigger circuit, a strobe generation circuit, and a phase detector. The edge trigger circuit may be configured to generate a falling clock signal and a rising clock signal based on a reference clock signal and a target clock signal. The strobe generation circuit may be configured to generate a falling strobe signal having a pulse which enables for a first amount of time, and generate a rising strobe signal having a pulse which enables for a second amount of time. The first and second amounts of time may be set on a basis of a phase relationship between the reference clock signal and the target clock signal. The phase detector may be configured to generate a phase detection signal based on the falling clock signal, the rising clock signal, the falling strobe signal and the rising strobe signal.

In an embodiment, a phase detection circuit may include an edge trigger circuit, a strobe generation circuit, and a phase detector. The edge trigger circuit may be configured to generate a falling clock signal and a rising clock signal by triggering edges of a reference clock signal and a target clock signal. The strobe generation circuit may be configured to generate a falling strobe signal and a rising strobe signal having pulse widths varying based on a pulse width of the falling clock signal within a single cycle of the falling clock signal and a pulse width of the rising clock signal within a single cycle of the rising clock signal. The phase detector may be configured to generate a positive output signal based on the falling clock signal and the falling strobe signal, generate a negative output signal based on the rising clock signal and the rising strobe signal, and generate a phase detection signal by comparing the positive output signal with the negative output signal.

BRIEF DESCRIPTION OF THE DRAWINGS

FIGS. 5A to 5C are schematic diagrams illustrating configurations and operations of an edge trigger circuit and a strobe generation circuit in accordance with an embodiment;

FIGS. 6A to 6C are schematic diagrams illustrating configurations and operations of an edge trigger circuit and a strobe generation circuit in accordance with an embodiment;

FIGS. 7A to 7C are schematic diagrams illustrating configurations and operations of an edge trigger circuit and a strobe generation circuit in accordance with an embodiment;

FIGS. 8A to 8C are schematic diagrams illustrating configurations and operations of strobe signal generators in accordance with an embodiment;

FIGS. 9A and 9B are schematic diagrams illustrating a configuration of a phase detector in accordance with an embodiment;

DETAILED DESCRIPTION

Hereinafter, a semiconductor apparatus according to various embodiments will be described below with reference to the accompanying drawings through various embodiments.

Figure 1:
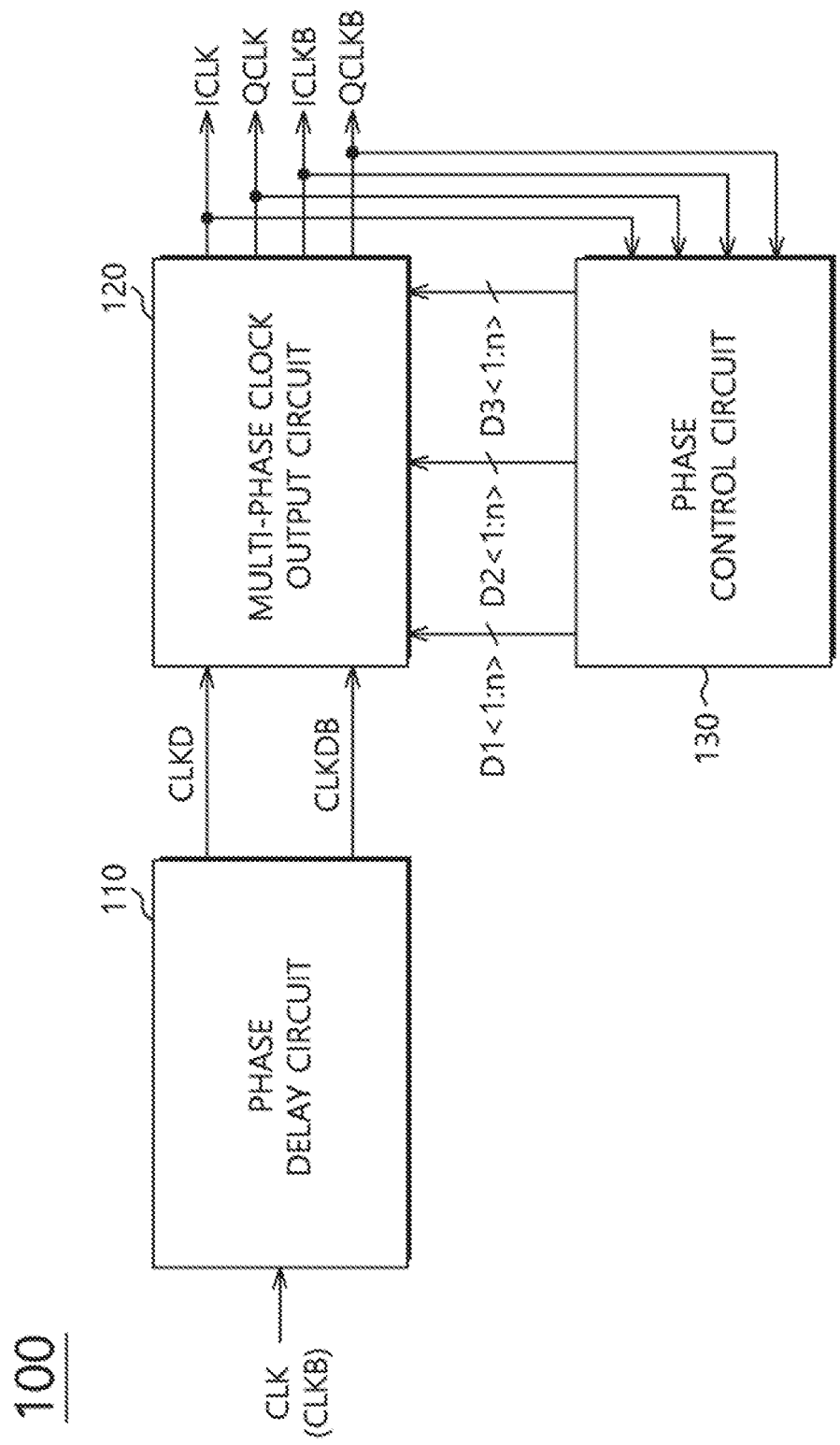
FIG. 1 is a schematic diagram illustrating a configuration of a clock generation circuit in accordance with an embodiment.

FIG. 1 is a schematic diagram illustrating a configuration of a clock generation circuit 100 in accordance with an embodiment. Referring to FIG. 1, the clock generation circuit 100 may generate, from a clock signal CLK, a plurality of internal clock signals having different phases from one another. The clock generation circuit 100 may detect the phases of the plurality of internal clock signals.

The clock generation circuit 100 may detect the phases of the plurality of internal clock signals by generating a detection clock signal and a strobe signal based on the plurality of internal clock signals; and by detecting a duty ratio of the detection clock signal. The clock generation circuit 100 may adjust the phases of the plurality of internal clock signals according to a result of the phase detection.

The clock generation circuit 100 may include a phase delay circuit 110, a multi-phase clock output circuit 120 and a phase control circuit 130. The phase delay circuit 110 may receive the clock signal CLK and may generate a delay clock signal CLKD by delaying the clock signal CLK. The phase delay circuit 110 may receive a complementary clock signal CLKB together with the clock signal CLK and may generate a complementary delay clock signal CLKDB together with the delay clock signal CLKD. The phase delay circuit 110 may generate the delay clock signal CLKD by delaying the clock signal CLK by a delay amount, which is determined on the basis of operation information of a semiconductor apparatus in which the clock generation circuit 100 is included. For example, the phase delay circuit 110 may include delay-locked loop circuit. The phase delay circuit 110 may delay the clock signal CLK to compensate for modelled delay amount and may lock the phase of the delay clock signal CLKD when delaying the clock signal CLK is completed. The phase delay circuit 110 may perform a coarse delay-lock operation and a fine delay-lock operation. The clock signal CLK may be delayed by units of first delay amount units by the coarse delay-lock operation and may be delayed by units of second delay amount units by the fine delay-lock operation. The first delay amount unit may be longer than the second delay amount unit. The phase delay circuit 110 may perform the fine delay-lock operation after completion of the coarse delay-lock operation. The phase delay circuit 110 may lock the phase of the delay clock signal CLKD after completion of the fine delay-lock operation. Any known delay-locked loop circuit may be applied as the phase delay circuit 110. In an embodiment, the phase delay circuit 110 may include a phase-locked loop circuit. Any known phase-locked loop circuit may be applied as the phase delay circuit 110. The phase delay circuit 110 may generate the delay clock signal CLKD by dividing a frequency of the clock signal CLK. The phase delay circuit 110 may generate the delay clock signal CLKD by halving the frequency of the clock signal CLK. In an embodiment, the phase delay circuit 110 might not divide the frequency of the clock signal CLK and may generate the delay clock signal CLKD having the same frequency as the clock signal CLK.

The multi-phase clock output circuit 120 may generate a plurality of internal clock signals having different phases from one another based on the delay clock signal CLKD. For example, the multi-phase clock output circuit 120 may generate a first internal clock signal ICLK, a second internal clock signal QCLK, a third internal clock signal ICLKB and a fourth internal clock signal QCLKB sequentially having neighbouring phases. The first internal clock signal ICLK may have a phase leading the second internal clock signal QCLK, the second internal clock signal QCLK may have a phase leading the third internal clock signal ICLKB, the third internal clock signal ICLKB may have a phase leading the fourth internal clock signal QCLKB and the fourth internal clock signal QCLKB may have a phase leading the first internal clock signal ICLK. The multi-phase clock output circuit 120 may generate the first to fourth internal clock signals ICLK, QCLK, ICLKB and QCLKB sequentially having a phase difference of 90 degrees. The second internal clock signal QCLK may have a phase lagging with the first internal clock signal ICLK by 90 degrees. The third internal clock signal ICLKB may have a phase lagging with the first internal clock signal ICLK by 180 degrees. The fourth internal clock signal QCLKB may have a phase lagging with the first internal clock signal ICLK by 270 degrees. The multi-phase clock output circuit 120 may generate the first internal clock signal ICLK and the third internal clock signal ICLKB based on the delay clock signal CLKD; and may generate the second internal clock signal QCLK and the fourth internal clock signal QCLKB based on the complementary delay clock signal CLKDB.

The multi-phase clock output circuit 120 may receive a delay control signal. The multi-phase clock output circuit 120 may adjust the phase of at least one among the first to fourth internal clock signals ICLK, QCLK, ICLKB and QCLKB based on the delay control signal. The multi-phase clock output circuit 120 may set, as a reference clock signal, any one among the plurality of internal clock signals ICLK, QCLK, ICLKB and QCLKB. The multi-phase clock output circuit 120 may adjust the phases of remaining ones other than the reference clock signal among the plurality of internal clock signals ICLK, QCLK, ICLKB and QCLKB by changing the phases of the remaining internal clock signals other than the reference clock signal. Therefore, the phases of the remaining internal clock signals other than the reference clock signal may adjusted to respectively have predetermined phase differences with reference to the reference clock signal. For example, the multi-phase clock output circuit 120 may set, as the reference clock signal, the first internal clock signal ICLK among the first to fourth internal clock signals ICLK, QCLK, ICLKB and QCLKB; and may adjust the phases of the second to fourth internal clock signals QCLK, ICLKB and QCLKB. The delay control signal may include a first delay control signal D1<1:n>, a second delay control signal D2<1:n> and a third delay control signal D3<1:n>, "n" being an integer equal to or greater than 2. The multi-phase clock output circuit 120 may adjust the phase of the second internal clock signal QCLK based on the first delay control signal D1<1:n>. The multi-phase clock output circuit 120 may adjust the phase of the third internal clock signal ICLKB based on the second delay control signal D2<1:n>. The multi-phase clock output circuit 120 may adjust the phase of the fourth internal clock signal QCLKB based on the third delay control signal D3<1:n>. The word "predetermined" as used herein with respect to a parameter, such as a predetermined phase difference, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The phase control circuit 130 may generate the delay control signal by receiving the plurality of internal clock signals ICLK, QCLK, ICLKB and QCLKB. The phase control circuit 130 may detect the phase of at least one among the plurality of internal clock signals ICLK, QCLK, ICLKB and QCLKB and may generate the delay control signal based on the detected phase. The at least one internal clock signal of the detected phase may be a target clock signal. The phase control circuit 130 may generate the delay control signal by detecting the phases of the reference clock signal and the target clock signal. For example, the reference clock signal may be the first internal clock signal ICLK and the target clock signal may be any one among the second to fourth internal clock signals QCLK, ICLKB and QCLKB.

The phase control circuit 130 may detect the phase of the second internal clock signal QCLK based on the phases of the first internal clock signal ICLK and the second internal clock signal QCLK. The phase control circuit 130 may generate the first delay control signal D1<1:n> based on the detected phase of the second internal clock signal QCLK. The phase control circuit 130 may detect the phase of the third internal clock signal ICLKB based on the phases of the first internal clock signal ICLK and the third internal clock signal ICLKB. The phase control circuit 130 may generate the second delay control signal D2<1:n> based on the detected phase of the third internal clock signal ICLKB. The phase control circuit 130 may detect the phase of the fourth internal clock signal QCLKB based on the phases of the first internal clock signal ICLK and the fourth internal clock signal QCLKB. The phase control circuit 130 may generate the third delay control signal D3<1:n> based on the detected phase of the fourth internal clock signal QCLKB.

Figure 2:
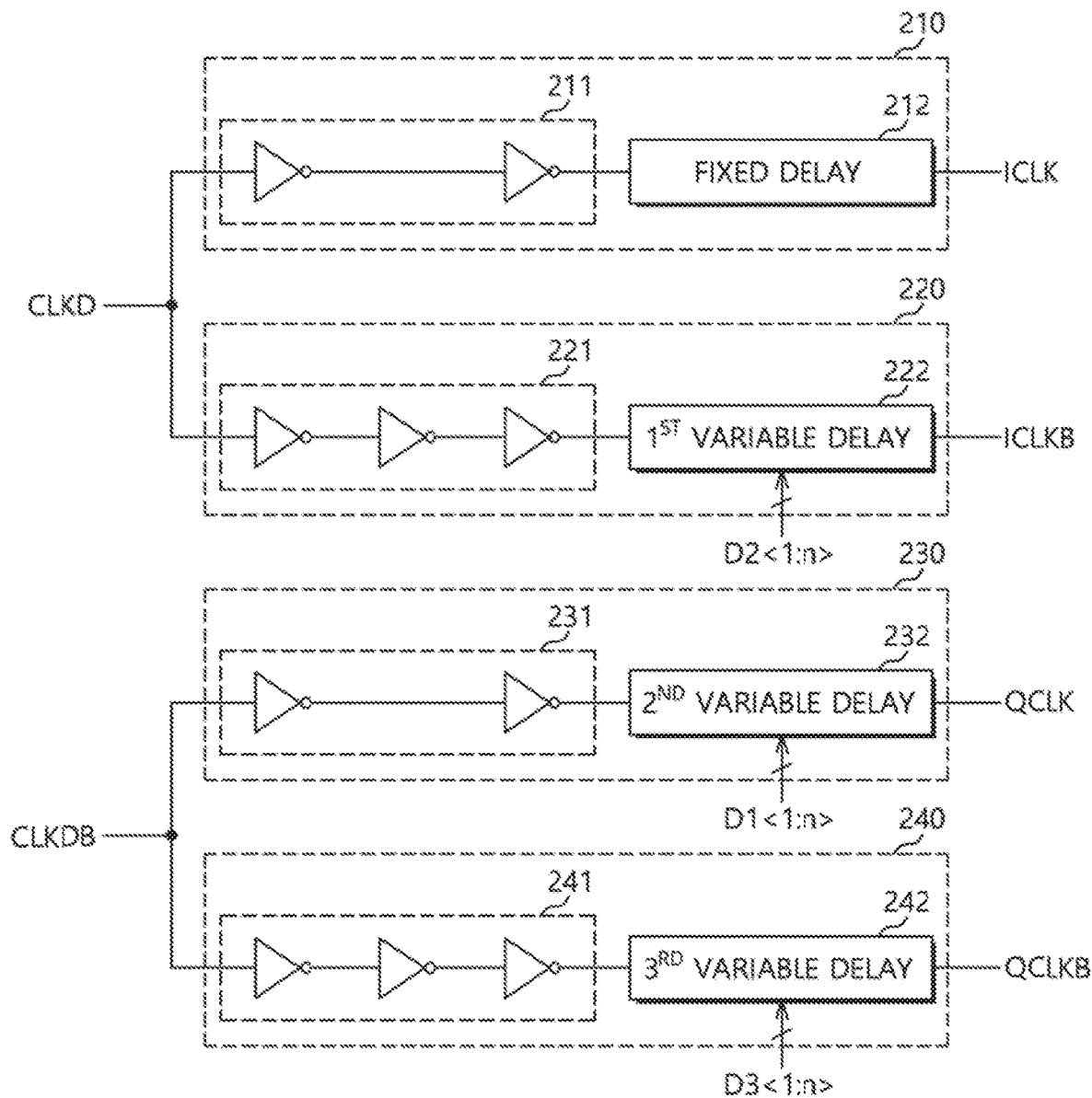
FIG. 2 is a schematic diagram illustrating a configuration of a multi-phase clock output circuit illustrated in FIG. 1.

FIG. 2 is a schematic diagram illustrating a configuration of the multi-phase clock output circuit 120 illustrated in FIG. 1. The multi-phase clock output circuit 120 may include a first clock output path 210, a second clock output path 220, a third clock output path 230 and a fourth clock output path 240. The first clock output path 210 may receive the delay clock signal CLKD and may generate the first internal clock signal ICLK based on the delay clock signal CLKD. The first clock output path 210 may generate the first internal clock signal ICLK by delaying the delay clock signal CLKD by an amount of fixed delay time.

The second clock output path 220 may receive the delay clock signal CLKD and may generate the third internal clock signal ICLKB based on the delay clock signal CLKD. The second clock output path 220 may invert the delay clock signal CLKD and may generate the third internal clock signal ICLKB by delaying the inverted delay clock signal CLKD by an amount of first variable delay time. The second clock output path 220 may receive the second delay control signal D2<1:n>. The first variable delay time may vary based on the second delay control signal D2<1:n>.

The third clock output path 230 may receive the complementary delay clock signal CLKDB and may generate the second internal clock signal QCLK based on the complementary delay clock signal CLKDB. The third clock output path 230 may generate the second internal clock signal QCLK by delaying the complementary delay clock signal CLKDB by an amount of second variable delay time. The third clock output path 230 may receive the first delay control signal D1<1:n>. The second variable delay time may vary based on the first delay control signal D1<1:n>.

The fourth clock output path 240 may receive the complementary delay clock signal CLKDB and may generate the fourth internal clock signal QCLKB based on the complementary delay clock signal CLKDB. The fourth clock output path 240 may invert the complementary delay clock signal CLKDB and may generate the fourth internal clock signal QCLKB by delaying the inverted complementary delay clock signal CLKDB by an amount of third variable delay time. The fourth clock output path 240 may receive the third delay control signal D3<1:n>. The third variable delay time may vary based on the third delay control signal D3<1:n>.

The first clock output path 210 may include a non-inversion buffer 211 and a fixed delay module 212. The non-inversion buffer 211 may buffer and output the delay clock signal CLKD. The fixed delay module 212 may output the first internal clock signal ICLK by delaying the output of the non-inversion buffer 211 by the amount of the fixed delay time. The second clock output path 220 may include an inversion buffer 221 and a first variable delay module 222. The inversion buffer 221 may invert, buffer and output the delay clock signal CLKD. The first variable delay module 222 may receive the output of the inversion buffer 221 and the second delay control signal D2<1:n>. A delay time of the first variable delay module 222 may be set on the basis of the second delay control signal D2<1:n>. The set delay time may be the first variable delay time. The first variable delay module 222 may output the third internal clock signal ICLKB by delaying the output of the inversion buffer 221 by the amount of the first variable delay time.

The third clock output path 230 may include a non-inversion buffer 231 and a second variable delay module 232. The non-inversion buffer 231 may buffer and output the complementary delay clock signal CLKDB. The second variable delay module 232 may receive the output of the non-inversion buffer 231 and the first delay control signal D1<1:n>. A delay time of the second variable delay module 232 may be set on the basis of the first delay control signal D1<1:n>. The set delay time may be the second variable delay time. The second variable delay module 232 may output the second internal clock signal QCLK by delaying the output of the non-inversion buffer 231 by the amount of the second variable delay time. The fourth clock output path 240 may include an inversion buffer 241 and a third variable delay module 242. The inversion buffer 241 may invert, buffer and output the complementary delay clock signal CLKDB. The third variable delay module 242 may receive the output of the inversion buffer 241 and the third delay control signal D3<1:n>. A delay time of the third variable delay module 242 may be set on the basis of the third delay control signal D3<1:n>. The set delay time may be the third variable delay time. The third variable delay module 242 may output the fourth internal clock signal QCLKB by delaying the output of the inversion buffer 241 by the amount of the third variable delay time.

Figure 3:
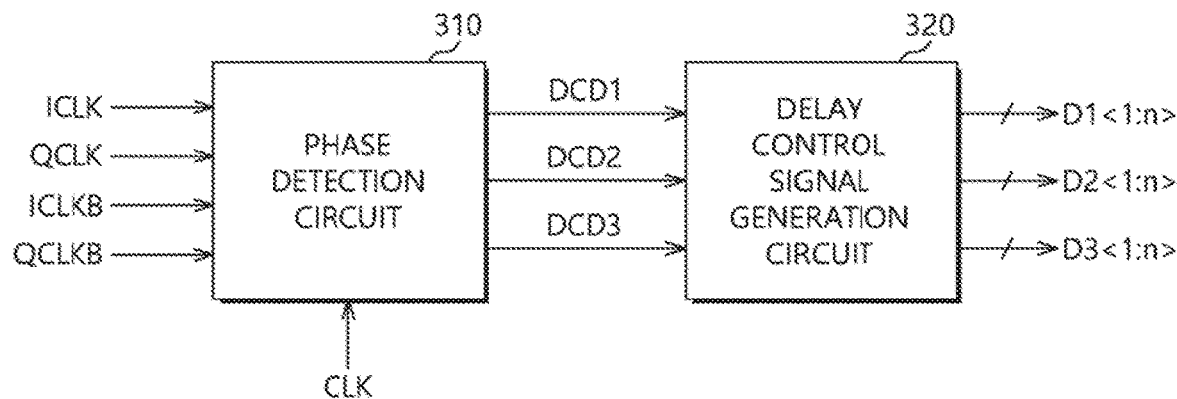
FIG. 3 is a schematic diagram illustrating a configuration of a phase control circuit illustrated in FIG. 1.

FIG. 3 is a schematic diagram illustrating a configuration of the phase control circuit 130 illustrated in FIG. 1. Referring to FIG. 3, the phase control circuit 130 may include a phase detection circuit 310 and a delay control signal generation circuit 320. The phase detection circuit 310 may receive the first to fourth internal clock signals ICLK, QCLK, ICLKB and QCLKB and may generate first to third phase detection signals DCD1, DCD2 and DCD3. The phase detection circuit 310 may generate a single phase detection signal based on two among the first to fourth internal clock signals ICLK, QCLK, ICLKB and QCLKB. The phase detection circuit 310 may generate the first phase detection signal DCD1 based on the first internal clock signal ICLK and the second internal clock signal QCLK. The phase detection circuit 310 may generate the second phase detection signal DCD2 based on the first internal clock signal ICLK and the third internal clock signal ICLKB. The phase detection circuit 310 may generate the third phase detection signal DCD3 based on the first internal clock signal ICLK and the fourth internal clock signal QCLKB. The phase detection circuit 310 may further receive the clock signal CLK. The phase detection circuit 310 may utilize the clock signal CLK to detect the phases of the second to fourth internal clock signals QCLK, ICLKB and QCLKB with reference to the first internal clock signal ICLK.

The delay control signal generation circuit 320 may receive the first to third phase detection signals DCD1, DCD2 and DCD3 and may generate the first to third delay control signals D1<1:n>, D2<1:n> and D3<1:n>. The delay control signal generation circuit 320 may generate the first delay control signal D1<1:n> based on the first phase detection signal DCD1. The delay control signal generation circuit 320 may change a code value of the first delay control signal D1<1:n> based on the first phase detection signal DCD1. The delay control signal generation circuit 320 may generate the second delay control signal D2<1:n> based on the second phase detection signal DCD2. The delay control signal generation circuit 320 may change a code value of the second delay control signal D2<1:n> based on the second phase detection signal DCD2. The delay control signal generation circuit 320 may generate the third delay control signal D3<1:n> based on the third phase detection signal DCD3. The delay control signal generation circuit 320 may change a code value of the third delay control signal D3<1:n> based on the third phase detection signal DCD3. For example, the delay control signal generation circuit 320 may decrease the code value of each of the first to third delay control signals D1<1:n>, D2<1:n> and D3<1:n> when the first to third phase detection signals DCD1, DCD2 and DCD3 have logic low levels. The delay control signal generation circuit 320 may increase the code value of each of the first to third delay control signals D1<1:n>, D2<1:n> and D3<1:n> when the first to third phase detection signals DCD1, DCD2 and DCD3 have logic high levels. When the code values of the first to third delay control signals D1<1:n>, D2<1:n> and D3<1:n> decrease, the amounts of the first to third variable delay time may decrease. When the code values of the first to third delay control signals D1<1:n>, D2<1:n> and D3<1:n> increase, the amount of the first to third variable delay time may increase.

Figure 4:
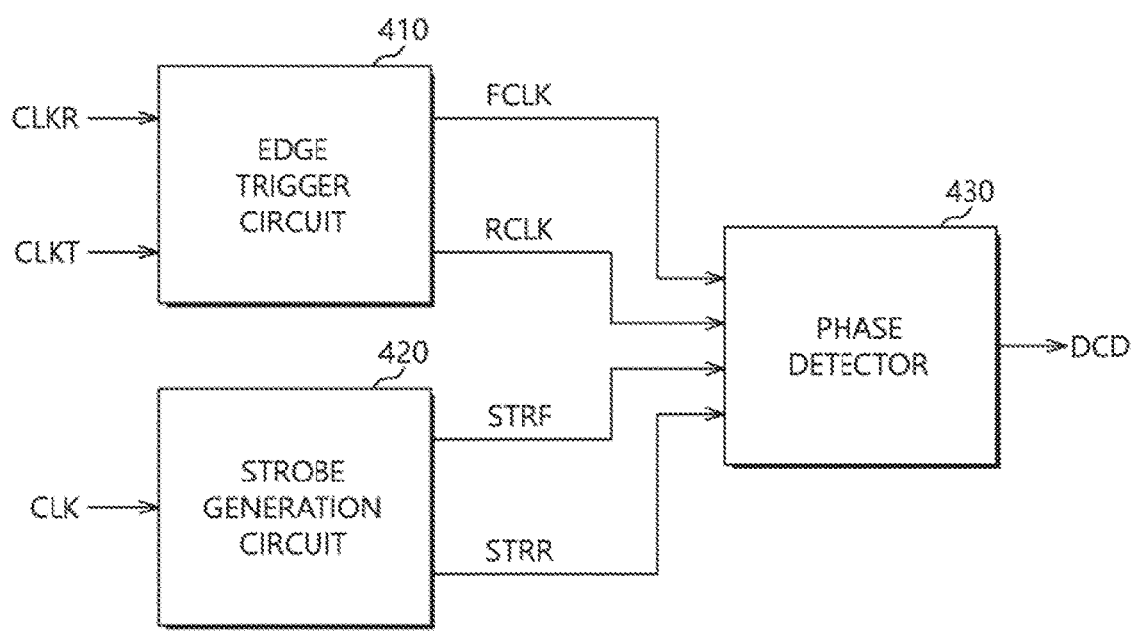
FIG. 4 is a schematic diagram illustrating a configuration of a phase control circuit in accordance with an embodiment.

FIG. 4 is a schematic diagram illustrating a configuration of a phase detection circuit 400 in accordance with an embodiment. The phase detection circuit 400 may include an edge trigger circuit 410, a strobe generation circuit 420 and a phase detector 430. The edge trigger circuit 410 may receive a reference clock signal CLKR and a target clock signal CLKT and may generate a falling clock signal FCLK and a rising clock signal RCLK based on the reference clock signal CLKR and the target clock signal CLKT. The edge trigger circuit 410 may generate the falling clock signal FCLK and the rising clock signal RCLK by triggering edges of the reference clock signal CLKR and the target clock signal CLKT. For example, the edge trigger circuit 410 may generate the falling clock signal FCLK and the rising clock signal RCLK with reference to rising edges of the reference clock signal CLKR and the target clock signal CLKT. The edge trigger circuit 410 may generate the falling clock signal FCLK and the rising clock signal RCLK by triggering the edges of the reference clock signal CLKR and the target clock signal CLKT according to various triggering scheme. A pulse width of the falling clock signal FCLK and a pulse width of the rising clock signal RCLK may change according to the edge triggering scheme.

The strobe generation circuit 420 may generate a falling strobe signal STRF and a rising strobe signal STRR. The falling strobe signal STRF may include a pulse, which enables for a first amount of time. The rising strobe signal STRR may include a pulse, which enables for a second amount of time. The first and second amounts of time may be the same with each other or may be different from each other. The first and second amounts of time may be set on the basis of a phase relationship between the reference clock signal CLKR and the target clock signal CLKT. The first and second amounts of time may vary according to the edge triggering scheme of the edge trigger circuit 410. The first and second amounts of time may be set such that a length of a high-level period of the falling clock signal FCLK included within the pulse of the falling strobe signal STRF is the same as a length of a high-level period of the rising clock signal RCLK included within the pulse of the rising strobe signal STRR. The pulse widths of the falling strobe signal STRF and the rising strobe signal STRR may vary according to the pulse widths of the falling clock signal FCLK and the rising clock signal RCLK. The pulse width of the falling strobe signal STRF may vary within a single cycle of the falling clock signal FCLK according to the pulse width of the falling clock signal FCLK. The pulse width of the rising strobe signal STRR may vary within a single cycle of the rising clock signal RCLK according to the pulse width of the rising clock signal RCLK. The falling strobe signal STRF and the rising strobe signal STRR may be generated on the basis of the clock signal CLK.

The phase detector 430 may receive the falling clock signal FCLK, the rising clock signal RCLK, the falling strobe signal STRF and the rising strobe signal STRR. The phase detector 430 may generate a phase detection signal DCD based on the falling clock signal FCLK, the rising clock signal RCLK, the falling strobe signal STRF and the rising strobe signal STRR. The phase detector 430 may detect the pulses of the falling clock signal FCLK, which occur within an enabled period of the falling strobe signal STRF. The phase detector 430 may detect the pulses of the rising clock signal RCLK, which occur within an enabled period of the rising strobe signal STRR. The phase detector 430 may generate the phase detection signal DCD based on a result of the phase detection.

Figure 5A:
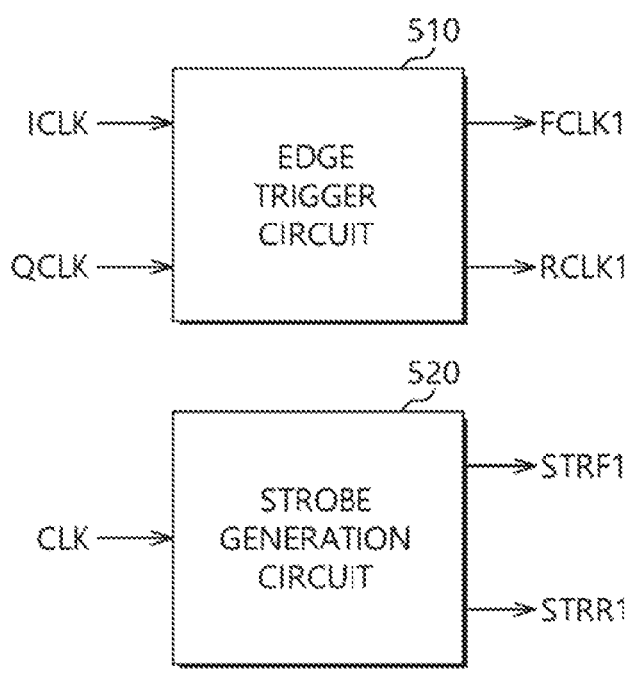

FIG. 5A is a schematic diagram illustrating configurations of an edge trigger circuit 510 and a strobe generation circuit 520 in accordance with an embodiment. FIGS. 5B and 5C are timing diagrams illustrating operations of the configurations illustrated in FIG. 5A. Referring to FIG. 5A, the edge trigger circuit 510 may receive the first internal clock signal ICLK as the reference clock signal CLKR and may receive the second internal clock signal QCLK as the target clock signal CLKT. The edge trigger circuit 510 may generate a first falling clock signal FCLK1 and a first rising clock signal RCLK1 by triggering the edges of the first internal clock signal ICLK and the second internal clock signal QCLK. The strobe generation circuit 520 may generate a first falling strobe signal STRF1 and a first rising strobe signal STRR1 based on the clock signal CLK. The strobe generation circuit 520 may adjust the pulse widths of the first falling strobe signal STRF1 and the first rising strobe signal STRR1 within single cycles of the first falling clock signal FCLK1 and the first rising clock signal RCLK1 according to the pulse widths of the first falling clock signal FCLK1 and the first rising clock signal RCLK1.

The edge trigger circuit 510 may generate the first falling clock signal FCLK1 having the pulse, which enables during a period from a rising edge of the first internal clock signal ICLK to a subsequent rising edge of the first internal clock signal ICLK. The edge trigger circuit 510 may generate the first rising clock signal RCLK1 having the pulse, which enables during a period from a rising edge of the second internal clock signal QCLK to a rising edge of the first internal clock signal ICLK. Referring to FIG. 5B, the second internal clock signal QCLK may have a phase lagging by 90 degrees with the first internal clock signal ICLK. The edge trigger circuit 510 may generate the first falling clock signal FCLK1 having the pulse, which enables during a period from a rising edge of the first internal clock signal ICLK to a subsequent rising edge of the first internal clock signal ICLK. The cycle of the first falling clock signal FCLK1 may be 2 times of the cycle of the first internal clock signal ICLK. Within a single cycle of the first falling clock signal FCLK1, the pulse width of the first falling clock signal FCLK1 may be 4 times (4UI) of a unit is amount of time. The unit amount of time UI may be an amount of time corresponding to a half of the cycle of the clock signal CLK and/or a quarter of the cycle of the first internal clock signal ICLK. The edge trigger circuit 510 may generate the first rising clock signal RCLK1 having a pulse, which enables during a period from a rising edge of the second internal clock signal QCLK to a rising edge of the first internal clock signal ICLK. The cycle of the first rising clock signal RCLK1 may be the same as the cycle of the first internal clock signal ICLK. Within a single cycle of the first rising clock signal RCLK1, the pulse width of the first rising clock signal RCLK1 may be 3 times (3UI) of the unit amount of time.

The strobe generation circuit 520 may generate the first falling strobe signal STRF1 having a pulse, which enables for the first amount of time; and may generate the first rising strobe signal STRR1 having a pulse, which enables for the second amount of time. The first amount of time may be longer than the second amount of time. The strobe generation circuit 520 may generate the first falling strobe signal STRF1 having a pulse, which enables for a longer time than the first rising strobe signal STRR1. For example, the first falling strobe signal STRF1 may include a pulse, which enables for a period corresponding to '3m' times of the cycle of the first internal clock signal ICLK and/or corresponding to '6m' times of the cycle of the clock signal CLK. Here, 'm' may be a multiple of 2. The first rising strobe signal STRR1 may include a pulse, which enables for a period corresponding to '2m' times of the cycle of the first internal clock signal ICLK and/or corresponding to '4m' times of the cycle of the clock signal CLK. The '3m' times and the '2m' times may be determined on the basis of a common multiple of the pulse widths of the first falling clock signal FCLK1 and the first rising clock signal RCLK1. That is, a single pulse of the first falling clock signal FCLK1 may occur during a period corresponding to two cycles of the first internal clock signal ICLK. The total pulse width of the first falling clock signal FCLK1, which occurs during a period corresponding to two cycles of the first internal clock signal ICLK, may correspond to 4 times (4UI) of the unit amount of time. Two pulses of the first rising clock signal RCLK1 may occur during a period corresponding to two cycles of the first internal clock signal ICLK; and the total pulse width of the first rising clock signal RCLK1, which occurs during a period corresponding to two cycles of the first internal clock signal ICLK, may correspond to 6 times (2*3UI=6UI) of the unit amount of time. Therefore, a least common multiple of the total pulse widths of the first falling clock signal FCLK1 and the first rising clock signal RCLK1 may be 12 times (12UI) of the unit amount of time.

When assuming 'm' as 4, the first falling strobe signal STRF1 may be enabled for a period corresponding to twelve cycles of the first internal clock signal ICLK and 6 pulses of the first falling clock signal FCLK1 may be included within the pulse of the first falling strobe signal STRF1. Because a single pulse of the first falling clock signal FCLK1 is 4 times (4UI) of the unit amount of time, a high-level period of the first falling clock signal FCLK1 corresponding to 24 times (6*4UI=24UI) of the unit amount of time may be included within the pulse of the first falling strobe signal STRF1. The first rising strobe signal STRR1 may be enabled for a period corresponding to eight cycles of the first internal clock signal ICLK and 8 pulses of the first rising clock signal RCLK1 may be included within the pulse of the first rising strobe signal STRR1. Because a single pulse of the first rising clock signal RCLK1 is 3 times (3UI) of the unit amount of time, a high-level period of the first rising clock signal RCLK1 corresponding to 24 times (8*3UI=24UI) of the unit amount of time may be included within the pulse of the first rising strobe signal STRR1.

In an embodiment, the edge trigger circuit 510 may generate the first falling clock signal FCLK1 having a pulse, which enables during a period from a rising edge of the first internal clock signal ICLK to a rising edge of the second internal clock signal QCLK. The edge trigger circuit 510 may generate the first rising clock signal RCLK1 having a pulse, which enables during a period from a rising edge of the second internal clock signal QCLK to a rising edge of the first internal clock signal ICLK. Referring to FIG. 5C, the second internal clock signal QCLK may have a phase lagging by 90 degrees with the first internal clock signal ICLK. The edge trigger circuit 510 may generate the first falling clock signal FCLK1 having the pulse, which enables during a period from a rising edge of the first internal clock signal ICLK to a rising edge of the second internal clock signal QCLK. The cycle of the first falling clock signal FCLK1 may be the same as the cycle of the first internal clock signal ICLK. Within a single cycle of the first falling clock signal FCLK1, the pulse width of the first falling clock signal FCLK1 may be the unit amount of time (1UI). The edge trigger circuit 510 may generate the first rising clock signal RCLK1 having a pulse, which enables during a period from a rising edge of the second internal clock signal QCLK to a rising edge of the first internal clock signal ICLK. The cycle of the first rising clock signal RCLK1 may be the same as the cycle of the first internal clock signal ICLK. Within a single cycle of the first rising clock signal RCLK1, the pulse width of the first rising clock signal RCLK1 may be 3 times (3UI) of the unit amount of time.

The strobe generation circuit 520 may generate the first falling strobe signal STRF1 having a pulse, which enables for the first amount of time; and may generate the first rising strobe signal STRR1 having a pulse, which enables for the second amount of time. The first amount of time may be longer than the second amount of time. The strobe generation circuit 520 may generate the first falling strobe signal STRF1 having a pulse, which enables for a longer time than the first rising strobe signal STRR1. For example, the first falling strobe signal STRF1 may include a pulse, which enables for a period corresponding to '3k' times of the cycle of the first internal clock signal ICLK and/or corresponding to '6k' times of the cycle of the clock signal CLK. Here, 'k' may be an integer equal to or greater than 1. The first rising strobe signal STRR1 may include a pulse, which enables for a period corresponding to 'k' times of the cycle of the first internal clock signal ICLK and/or corresponding to '2k' times of the cycle of the clock signal CLK. The '3k' times and the 'k' times may be determined on the basis of a common multiple of the pulse widths of the first falling clock signal FCLK1 and the first rising clock signal RCLK1. That is, a single pulse of the first falling clock signal FCLK1 may occur during a period corresponding to a single cycle of the first internal clock signal ICLK. The total pulse width of the first falling clock signal FCLK1, which occurs during a period corresponding to a single cycle of the first internal clock signal ICLK, may correspond to the unit amount of time (1UI). A single pulse of the first rising clock signal RCLK1 may occur during a period corresponding to a single cycle of the first internal clock signal ICLK; and the total pulse width of the first rising clock signal RCLK1, which occurs during a period corresponding to a single cycle of the first internal clock signal ICLK, may correspond to 3 times (3UI) of the unit amount of time. Therefore, a least common multiple of the total pulse widths of the first falling clock signal FCLK1 and the first rising clock signal RCLK1 may be 3 times (3UI) of the unit amount of time.

When assuming 'k' as 4, the first falling strobe signal STRF1 may be enabled for a period corresponding to twelve cycles of the first internal clock signal ICLK and 12 pulses of the first falling clock signal FCLK1 may be included within the pulse of the first falling strobe signal STRF1. Because a single pulse of the first falling clock signal FCLK1 is the unit amount of time (1UI), a high-level period of the first falling clock signal FCLK1 corresponding to 12 times (12*1UI=12UI) of the unit amount of time may be included within the pulse of the first falling strobe signal STRF1. The first rising strobe signal STRR1 may be enabled for a period corresponding to four cycles of the first internal clock signal ICLK and four pulses of the first rising clock signal RCLK1 may be included within the pulse of the first rising strobe signal STRR1. Because a single pulse of the first rising clock signal RCLK1 is 3 times (3UI) of the unit amount of time, a high-level period of the first rising clock signal RCLK1 corresponding to 12 times (4*3UI=12UI) of the unit amount of time may be included within the pulse of the first rising strobe signal STRR1.

Figure 6A:
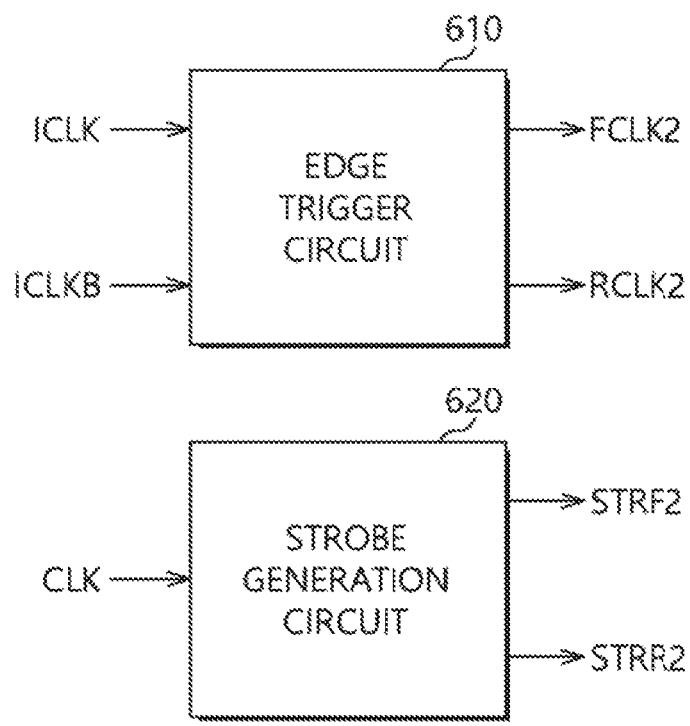

FIG. 6A is a schematic diagram illustrating configurations of an edge trigger circuit 610 and a strobe generation circuit 620 in accordance with an embodiment. FIGS. 6B and 6C are timing diagrams illustrating operations of the configurations illustrated in FIG. 6A. Referring to FIG. 6A, the edge trigger circuit 610 may receive the first internal clock signal ICLK as the reference clock signal CLKR and may receive the third internal clock signal ICLKB as the target clock signal CLKT. The edge trigger circuit 610 may generate a second falling clock signal FCLK2 and a second rising clock signal RCLK2 by triggering the edges of the first internal clock signal ICLK and the third internal clock signal ICLKB. The strobe generation circuit 620 may generate a second falling strobe signal STRF2 and a second rising strobe signal STRR2 based on the clock signal CLK. The strobe generation circuit 620 may adjust the pulse widths of the second falling strobe signal STRF2 and the second rising strobe signal STRR2 within single cycles of the second falling clock signal FCLK2 and the second rising clock signal RCLK2 according to the pulse widths of the second falling clock signal FCLK2 and the second rising clock signal RCLK2.

The edge trigger circuit 610 may generate the second falling clock signal FCLK2 having the pulse, which enables during a period from a rising edge of the first internal clock signal ICLK to a subsequent rising edge of the first internal clock signal ICLK. The edge trigger circuit 610 may generate the second rising clock signal RCLK2 having the pulse, which enables during a period from a rising edge of the first internal clock signal ICLK to a rising edge of the third internal clock signal ICLKB. Referring to FIG. 6B, the third internal clock signal ICLKB may have a phase lagging by 180 degrees with the first internal clock signal ICLK. The edge trigger circuit 610 may generate the second falling clock signal FCLK2 having the pulse, which enables during a period from a rising edge of the first internal clock signal ICLK to a subsequent rising edge of the first internal clock signal ICLK. The cycle of the second falling clock signal FCLK2 may be 2 times of the cycle of the first internal clock signal ICLK. Within a single cycle of the second falling clock signal FCLK2, the pulse width of the second falling clock signal FCLK2 may be 4 times (4UI) of the unit amount of time. The edge trigger circuit 610 may generate the second rising clock signal RCLK2 having a pulse, which enables during a period from a rising edge of the first internal clock signal ICLK to a rising edge of the third internal clock signal ICLKB. The cycle of the second rising clock signal RCLK2 may be the same as the cycle of the first internal clock signal ICLK. Within a single cycle of the second rising clock signal RCLK2, the pulse width of the second rising clock signal RCLK2 may be 2 times (2UI) of the unit amount of time.

The strobe generation circuit 620 may generate the second falling strobe signal STRF2 having a pulse, which enables for the first amount of time; and may generate the second rising strobe signal STRR2 having a pulse, which enables for the second amount of time. The first amount of time may be the same as the second amount of time. For example, the second falling strobe signal STRF2 may include a pulse, which enables for a period corresponding to 'm' times of the cycle of the first internal clock signal ICLK and/or corresponding to '2m' times of the cycle of the clock signal CLK. The second rising strobe signal STRR2 may include a pulse, which enables for a period corresponding to 'm' times of the cycle of the first internal clock signal ICLK and/or corresponding to '2m' times of the cycle of the clock signal CLK. The 'm' times may be determined on the basis of a common multiple of the pulse widths of the second falling clock signal FCLK2 and the second rising clock signal RCLK2. That is, a single pulse of the second falling clock signal FCLK2 may occur during a period corresponding to two cycles of the first internal clock signal ICLK. The total pulse width of the second falling clock signal FCLK2, which occurs during a period corresponding to two cycles of the first internal clock signal ICLK, may correspond to 4 times (4UI) of the unit amount of time. 2 pulses of the second rising clock signal RCLK2 may occur during a period corresponding to two cycles of the first internal clock signal ICLK; and the total pulse width of the second rising clock signal RCLK2, which occurs during a period corresponding to two cycles of the first internal clock signal ICLK, may correspond to 4 times (4UI) of the unit amount of time. Therefore, a least common multiple of the total pulse widths of the second falling clock signal FCLK2 and the second rising clock signal RCLK2 may be 4 times (4UI) of the unit amount of time.

When assuming 'm' as 4, the second falling strobe signal STRF2 may be enabled for a period corresponding to eight cycles of the first internal clock signal ICLK and four pulses of the second falling clock signal FCLK2 may be included within the pulse of the second falling strobe signal STRF2. Because a single pulse of the second falling clock signal FCLK2 is 4 times (4UI) of the unit amount of time, a high-level period of the second falling clock signal FCLK2 corresponding to 16 times (4*4UI=16UI) of the unit amount of time may be included within the pulse of the second falling strobe signal STRF2. The second rising strobe signal STRR2 may be enabled for a period corresponding to eight cycles of the first internal clock signal ICLK and eight pulses of the second rising clock signal RCLK2 may be included within the pulse of the second rising strobe signal STRR2. Because a single pulse of the second rising clock signal RCLK2 is 2 times (2UI) of the unit amount of time, a high-level period of the second rising clock signal RCLK2 corresponding to 16 times (8*2UI=16UI) of the unit amount of time may be included within the pulse of the second rising strobe signal STRR2.

In an embodiment, the edge trigger circuit 610 may generate the second falling clock signal FCLK2 having a pulse, which enables during a period from a rising edge of the first internal clock signal ICLK to a rising edge of the third internal clock signal ICLKB. The edge trigger circuit 610 may generate the second rising clock signal RCLK2 having a pulse, which enables during a period from a rising edge of the third internal clock signal ICLKB to a rising edge of the first internal clock signal ICLK. Referring to FIG. 6C, the third internal clock signal ICLKB may have a phase lagging by 180 degrees with the first internal clock signal ICLK. The edge trigger circuit 610 may generate the second falling clock signal FCLK2 having the pulse, which enables during a period from a rising edge of the first internal clock signal ICLK to a rising edge of the third internal clock signal ICLKB. The cycle of the second falling clock signal FCLK2 may be the same as the cycle of the first internal clock signal ICLK. Within a single cycle of the second falling clock signal FCLK2, the pulse width of the second falling clock signal FCLK2 may be 2 times (2UI) of the unit amount of time. The edge trigger circuit 610 may generate the second rising clock signal RCLK2 having a pulse, which enables during a period from a rising edge of the third internal clock signal ICLKB to a rising edge of the first internal clock signal ICLK. The cycle of the second rising clock signal RCLK2 may be the same as the cycle of the first internal clock signal ICLK. Within a single cycle of the second rising clock signal RCLK2, the pulse width of the second rising clock signal RCLK2 may be 2 times (2UI) of the unit amount of time.

The strobe generation circuit 620 may generate the second falling strobe signal STRF2 having a pulse, which enables for the first amount of time; and may generate the second rising strobe signal STRR2 having a pulse, which enables for the second amount of time. The first amount of time may be the same as the second amount of time. For example, the second falling strobe signal STRF2 may include a pulse, which enables for a period corresponding to 'k' times of the cycle of the first internal clock signal ICLK and/or corresponding to '2k' times of the cycle of the clock signal CLK. The second rising strobe signal STRR2 may include a pulse, which enables for a period corresponding to 'k' times of the cycle of the first internal clock signal ICLK and/or corresponding to '2k' times of the cycle of the clock signal CLK. The 'k' times may be determined on the basis of a common multiple of the pulse widths of the second falling clock signal FCLK2 and the second rising clock signal RCLK2. That is, a single pulse of the second falling clock signal FCLK2 may occur during a period corresponding to a single cycle of the first internal clock signal ICLK. The total pulse width of the second falling clock signal FCLK2, which occurs during a period corresponding to a single cycle of the first internal clock signal ICLK, may correspond to 2 times (2UI) of the unit amount of time. A single pulse of the second rising clock signal RCLK2 may occur during a period corresponding to a single cycle of the first internal clock signal ICLK; and the total pulse width of the second rising clock signal RCLK2, which occurs during a period corresponding to a single cycle of the first internal clock signal ICLK, may correspond to 2 times (2UI) of the unit amount of time. Therefore, a least common multiple of the total pulse widths of the second falling clock signal FCLK2 and the second rising clock signal RCLK2 may be 2 times (2UI) of the unit amount of time.

When assuming 'k' as 4, the second falling strobe signal STRF2 may be enabled for a period corresponding to four cycles of the first internal clock signal ICLK and four pulses of the second falling clock signal FCLK2 may be included within the pulse of the second falling strobe signal STRF2. Because a single pulse of the second falling clock signal FCLK2 is 2 times (2UI) of the unit amount of time, a high-level period of the second falling clock signal FCLK2 corresponding to 8 times (4*2UI=8UI) of the unit amount of time may be included within the pulse of the second falling strobe signal STRF2. The second rising strobe signal STRR2 may be enabled for a period corresponding to four cycles of the first internal clock signal ICLK and four pulses of the second rising clock signal RCLK2 may be included within the pulse of the second rising strobe signal STRR2. Because a single pulse of the second rising clock signal RCLK2 is 2 times (2UI) of the unit amount of time, a high-level period of the second rising clock signal RCLK2 corresponding to 8 times (4*2UI=8UI) of the unit amount of time may be included within the pulse of the second rising strobe signal STRR2.

Figure 7A:
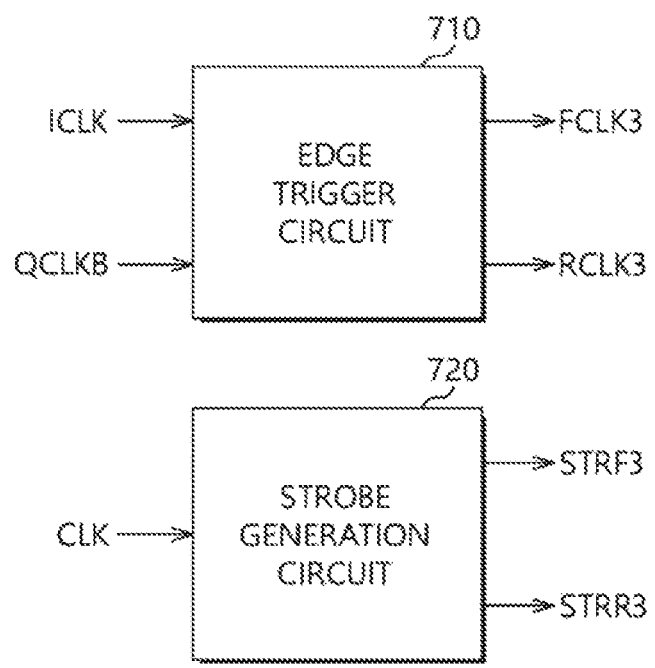

FIG. 7A is a schematic diagram illustrating configurations of an edge trigger circuit 710 and a strobe generation circuit 720 in accordance with an embodiment. FIGS. 7B and 7C are timing diagrams illustrating operations of the configurations illustrated in FIG. 7A. Referring to FIG. 7A, the edge trigger circuit 710 may receive the first internal clock signal ICLK as the reference clock signal CLKR and may receive the fourth internal clock signal QCLKB as the target clock signal CLKT. The edge trigger circuit 710 may generate a third falling clock signal FCLK3 and a third rising clock signal RCLK3 by triggering the edges of the first internal clock signal ICLK and the fourth internal clock signal QCLKB. The strobe generation circuit 720 may generate a third falling strobe signal STRF3 and a third rising strobe signal STRR3 based on the clock signal CLK. The strobe generation circuit 720 may adjust the pulse widths of the third falling strobe signal STRF3 and the third rising strobe signal STRR3 within single cycles of the third falling clock signal FCLK3 and the third rising clock signal RCLK3 according to the pulse widths of the third falling clock signal FCLK3 and the third rising clock signal RCLK3.

The edge trigger circuit 710 may generate the third falling clock signal FCLK3 having the pulse, which enables during a period from a rising edge of the first internal clock signal ICLK to a subsequent rising edge of the first internal clock signal ICLK. The edge trigger circuit 710 may generate the third rising clock signal RCLK3 having the pulse, which enables during a period from a rising edge of the first internal clock signal ICLK to a rising edge of the fourth internal clock signal QCLKB. Referring to FIG. 7B, the fourth internal clock signal QCLKB may have a phase lagging by 270 degrees with the first internal clock signal ICLK. The edge trigger circuit 710 may generate the third falling clock signal FCLK3 having the pulse, which enables during a period from a rising edge of the first internal clock signal ICLK to a subsequent rising edge of the first internal clock signal ICLK. The cycle of the third falling clock signal FCLK3 may be 2 times of the cycle of the first internal clock signal ICLK. Within a single cycle of the third falling clock signal FCLK3, the pulse width of the third falling clock signal FCLK3 may be 4 times (4UI) of the unit amount of time. The edge trigger circuit 710 may generate the third rising clock signal RCLK3 having a pulse, which enables during a period from a rising edge of the first internal clock signal ICLK to a rising edge of the fourth internal clock signal QCLKB. The cycle of the third rising clock signal RCLK3 may be the same as the cycle of the first internal clock signal ICLK. Within a single cycle of the third rising clock signal RCLK3, the pulse width of the third rising clock signal RCLK3 may be 3 times (3UI) of the unit amount of time.

The strobe generation circuit 720 may generate the third falling strobe signal STRF3 having a pulse, which enables for the first amount of time; and may generate the third rising strobe signal STRR3 having a pulse, which enables for the second amount of time. The first amount of time may be longer than the second amount of time. The strobe generation circuit 720 may generate the third falling strobe signal STRF3 having a pulse, which enables for a longer time than the third rising strobe signal STRR3. For example, the third falling strobe signal STRF3 may include a pulse, which enables for a period corresponding to '3m' times of the cycle of the first internal clock signal ICLK and/or corresponding to '6m' times of the cycle of the clock signal CLK. The third rising strobe signal STRR3 may include a pulse, which enables for a period corresponding to '2m' times of the cycle of the first internal clock signal ICLK and/or corresponding to '4m' times of the cycle of the clock signal CLK. The '3m' times and the '2m' times may be determined on the basis of a common multiple of the pulse widths of the third falling clock signal FCLK3 and the third rising clock signal RCLK3. That is, a single pulse of the third falling clock signal FCLK3 may occur during a period corresponding to two cycles of the first internal clock signal ICLK. The total pulse width of the third falling clock signal FCLK3, which occurs during a period corresponding to two cycles of the first internal clock signal ICLK, may correspond to 4 times (4UI) of the unit amount of time. Two pulses of the third rising clock signal RCLK3 may occur during a period corresponding to two cycles of the first internal clock signal ICLK; and the total pulse width of the third rising clock signal RCLK3, which occurs during a period corresponding to two cycles of the first internal clock signal ICLK, may correspond to 6 times (2*3UI=6UI) of the unit amount of time. Therefore, a least common multiple of the total pulse widths of the third falling clock signal FCLK3 and the third rising clock signal RCLK3 may be 12 times (12UI) of the unit amount of time.

When assuming 'm' as 4, the third falling strobe signal STRF3 may be enabled for a period corresponding to twelve cycles of the first internal clock signal ICLK and six pulses of the third falling clock signal FCLK3 may be included within the pulse of the third falling strobe signal STRF3. Because a single pulse of the third falling clock signal FCLK3 is 4 times (4UI) of the unit amount of time, a high-level period of the third falling clock signal FCLK3 corresponding to 24 times (6*4UI=24UI) of the unit amount of time may be included within the pulse of the third falling strobe signal STRF3. The third rising strobe signal STRR3 may be enabled for a period corresponding to eight periods of the first internal clock signal ICLK and eight pulses of the third rising clock signal RCLK3 may be included within the pulse of the third rising strobe signal STRR3. Because a single pulse of the third rising clock signal RCLK3 is 3 times (3UI) of the unit amount of time, a high-level period of the third rising clock signal RCLK3 corresponding to 24 times (8*3UI=24UI) of the unit amount of time may be included within the pulse of the third rising strobe signal STRR3.

In an embodiment, the edge trigger circuit 710 may generate the third falling clock signal FCLK3 having a pulse, which enables during a period from a rising edge of the first internal clock signal ICLK to a rising edge of the fourth internal clock signal QCLKB. The edge trigger circuit 710 may generate the third rising clock signal RCLK3 having a pulse, which enables during a period from a rising edge of the fourth internal clock signal QCLKB to a rising edge of the first internal clock signal ICLK. Referring to FIG. 7C, the fourth internal clock signal QCLKB may have a phase lagging by 270 degrees with the first internal clock signal ICLK. The edge trigger circuit 710 may generate the third falling clock signal FCLK3 having the pulse, which enables during a period from a rising edge of the first internal clock signal ICLK to a rising edge of the fourth internal clock signal QCLKB. The cycle of the third falling clock signal FCLK3 may be the same as the cycle of the first internal clock signal ICLK. Within a single cycle of the third falling clock signal FCLK3, the pulse width of the third falling clock signal FCLK3 may be 3 times (3UI) of the unit amount of time. The edge trigger circuit 710 may generate the third rising clock signal RCLK3 having a pulse, which enables during a period from a rising edge of the fourth internal clock signal QCLKB to a rising edge of the first internal clock signal ICLK. The cycle of the third rising clock signal RCLK3 may be the same as the cycle of the first internal clock signal ICLK. Within a single cycle of the third rising clock signal RCLK3, the pulse width of the third rising clock signal RCLK3 may be the unit amount of time (1UI).

The strobe generation circuit 720 may generate the third falling strobe signal STRF3 having a pulse, which enables for the first amount of time; and may generate the third rising strobe signal STRR3 having a pulse, which enables for the second amount of time. The first amount of time may be shorter than the second amount of time. The strobe generation circuit 720 may generate the third rising strobe signal STRR3 having a pulse, which enables for a longer time than the third falling strobe signal STRF3. For example, the third falling strobe signal STRF3 may include a pulse, which enables for a period corresponding to 'k' times of the cycle of the first internal clock signal ICLK and/or corresponding to '2k' times of the cycle of the clock signal CLK. The third rising strobe signal STRR3 may include a pulse, which enables for a period corresponding to '3k' times of the cycle of the first internal clock signal ICLK and/or corresponding to '6k' times of the cycle of the clock signal CLK. The 'k' times and the '3k' times may be determined on the basis of a common multiple of the pulse widths of the third falling clock signal FCLK3 and the third rising clock signal RCLK3. That is, a single pulse of the third falling clock signal FCLK3 may occur during a period corresponding to a single cycle of the first internal clock signal ICLK. The total pulse width of the third falling clock signal FCLK3, which occurs during a period corresponding to a single cycle of the first internal clock signal ICLK, may correspond to 3 times (3UI) of the unit amount of time. A single pulse of the third rising clock signal RCLK3 may occur during a period corresponding to a single cycle of the first internal clock signal ICLK; and the total pulse width of the third rising clock signal RCLK3, which occurs during a period corresponding to a single cycle of the first internal clock signal ICLK, may correspond to the unit amount of time (1UI). Therefore, a least common multiple of the total pulse widths of the third falling clock signal FCLK3 and the third rising clock signal RCLK3 may be 3 times (3UI) of the unit amount of time.

When assuming 'k' as 4, the third falling strobe signal STRF3 may be enabled for a period corresponding to four cycles of the first internal clock signal ICLK and four pulses of the third falling clock signal FCLK3 may be included within the pulse of the third falling strobe signal STRF3. Because a single pulse of the third falling clock signal FCLK3 is 3 times (3UI) of the unit amount of time, a high-level period of the third falling clock signal FCLK3 corresponding to 12 times (4*3UI=12UI) of the unit amount of time may be included within the pulse of the third falling strobe signal STRF3. The third rising strobe signal STRR3 may be enabled for a period corresponding to twelve cycles of the first internal clock signal ICLK and twelve pulses of the third rising clock signal RCLK3 may be included within the pulse of the third rising strobe signal STRR3. Because a single pulse of the third rising clock signal RCLK3 is the unit amount of time (1UI), a high-level period of the third rising clock signal RCLK3 corresponding to 12 times (12*1UI=12UI) of the unit amount of time may be included within the pulse of the third rising strobe signal STRR3.

Figure 8A:
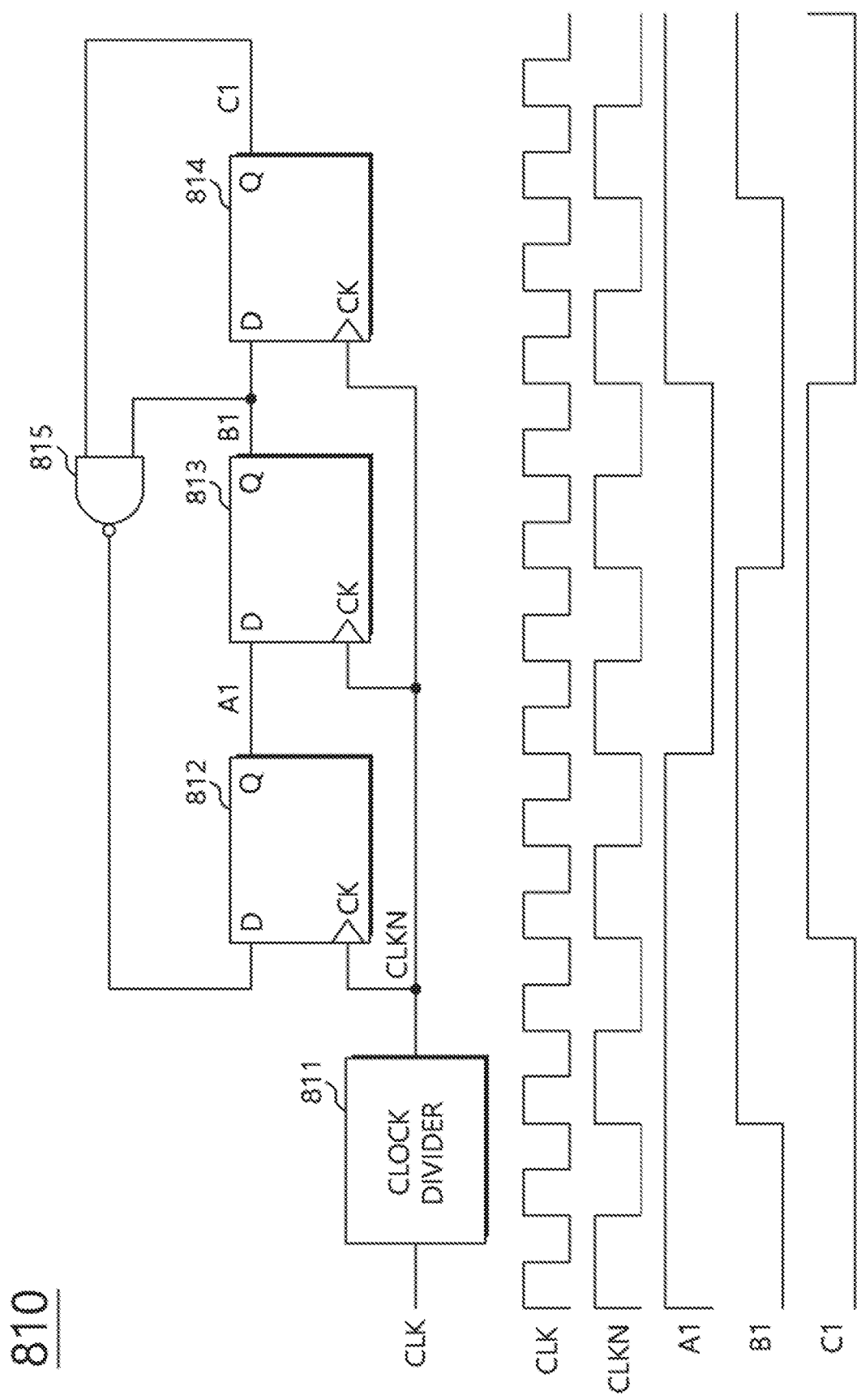

FIG. 8A is a schematic diagram illustrating a configuration and an operation of a strobe signal generator 810 in accordance with an embodiment. Referring to FIG. 8A, the strobe signal generator 810 may include a clock divider 811, a first flip-flop 812, a second flip-flop 813, a third flip-flop 814 and a NAND gate 815. The clock divider 811 may receive the clock signal CLK. The clock divider 811 may generate a division clock signal CLKN by dividing a frequency of the clock signal CLK. For example, the clock divider 811 may generate the division clock signal CLKN by halving the frequency of the clock signal CLK. The first flip-flop 812, the second flip-flop 813 and the third flip-flop 814 may commonly receive the division clock signal CLKN at their clock nodes CK. An input node D of the first flip-flop 812 may be coupled to an output node of the NAND gate 815. An input node D of the second flip-flop 813 may be coupled to an output node Q of the first flip-flop 812. An output node Q of the second flip-flop 813 may be coupled to both of a first input node of the NAND gate 815 and an input node D of the third flip-flop 814. An output node Q of the third flip-flop 814 may be coupled to a second input node of the NAND gate 815.

The clock divider 811 may generate the division clock signal CLKN by dividing the frequency of the clock signal CLK. A cycle of the division clock signal CLKN may be 2 times of a cycle of the clock signal CLK. A signal 131 output from the output node of the second flip-flop 813 may have a phase lagging by a single cycle of the division clock signal CLKN with a signal A1 output through the output node Q of the first flip-flop 812. A signal C1 output from the output node Q of the third flip-flop 814 may have a phase lagging by a single cycle of the division clock signal CLKN with the signal 131 output through the output node Q of the second flip-flop 813. When the signals 131 and C1 output through the output nodes Q of the second flip-flop 813 and the third flip-flop 814 have logic high levels, the NAND gate 815 may output an output signal having a logic low level and the first flip-flop 812 may change a logic level of the signal A1, which is output through the first flip-flop 812, to a logic low level in synchronization with a rising edge of the division clock signal CLKN. Therefore, the strobe signal generator 810 may generate a strobe signal having a pulse, which enables for 3 periods of the division clock signal CLKN. Any one among the signals A1, 131 and C1 may be output as the strobe signal.

FIG. 8B is a schematic diagram illustrating a configuration and an operation of a strobe signal generator 820 in accordance with an embodiment. Referring to FIG. 8B, the strobe signal generator 820 may include a clock divider 821, a first flip-flop 822, a second flip-flop 823, a third flip-flop 824 and a NOR gate 825. The clock divider 821 may receive the clock signal CLK. The clock divider 821 may generate a division clock signal CLKN by dividing a frequency of the clock signal CLK. For example, the clock divider 821 may generate the division clock signal CLKN by halving the frequency of the clock signal CLK. The first flip-flop 822, the second flip-flop 823 and the third flip-flop 824 may commonly receive the division clock signal CLKN at their clock nodes CK. An input node D of the first flip-flop 822 may be coupled to an output node of the NOR gate 825. An input node D of the second flip-flop 823 may be coupled to an output node Q of the first flip-flop 822. An output node Q of the second flip-flop 823 may be coupled to both of a first input node of the NOR gate 825 and an input node D of the third flip-flop 824. An output node Q of the third flip-flop 824 may be coupled to a second input node of the NOR gate 825.

The clock divider 821 may generate the division clock signal CLKN by dividing the frequency of the clock signal CLK. A cycle of the division clock signal CLKN may be 2 times of a cycle of the clock signal CLK. A signal B2 output from the output node of the second flip-flop 823 may have a phase lagging by a single cycle of the division clock signal CLKN with a signal A2 output through the output node Q of the first flip-flop 822. A signal C2 output from the output node Q of the third flip-flop 824 may have a phase lagging by a single cycle of the division clock signal CLKN with the signal B2 output through the output node Q of the second flip-flop 823. When any one between the signals B2 and C2 output through the output nodes Q of the second flip-flop 823 and the third flip-flop 824 has a logic high level, the NOR gate 825 may output an output signal having a logic low level and the first flip-flop 822 may change a logic level of the signal A2, which is output through the first flip-flop 822, to a logic low level in synchronization with a rising edge of the division clock signal CLKN. Therefore, the strobe signal generator 820 may generate a strobe signal having a pulse, which enables for two cycles of the division clock signal CLKN. Any one among the signals A2, B2 and C2 may be output as the strobe signal.

FIG. 8C is a schematic diagram illustrating a configuration and an operation of a strobe signal generator 830 in accordance with an embodiment. Referring to FIG. 8C, the strobe signal generator 830 may include a clock divider 831, a first flip-flop 832, a second flip-flop 833, a third flip-flop 834, a fourth flip-flop 835, a first OR gate 836, a second OR gate 837 and a NOR gate 838. The clock divider 831 may receive the clock signal CLK. The clock divider 831 may generate a division clock signal CLKN by dividing a frequency of the clock signal CLK. For example, the clock divider 831 may generate the division clock signal CLKN by halving the frequency of the clock signal CLK. The first flip-flop 832, the second flip-flop 833, the third flip-flop 834 and the fourth flip-flop 835 may commonly receive the division clock signal CLKN at their clock nodes CK. An input node D of the first flip-flop 832 may be coupled to an output node of the NOR gate 838. An output node Q of the first flip-flop 832 may be coupled to both of an input node D of the second flip-flop 833 and a first input node of the first OR gate 836. An output node Q of the second flip-flop 833 may be coupled to both of an input node D of the third flip-flop 834 and a second input node of the first OR gate 836. An output node Q of the third flip-flop 834 may be coupled to both of an input node D of the fourth flip-flop 835 and a first input node of the second OR gate 837. An output node Q of the fourth flip-flop 835 may be coupled to a second input node of the second OR gate 837. A first input node of the NOR gate 838 may be coupled to an output node of the first OR gate 836 and a second input node of the NOR gate 838 may be coupled to an output node of the second OR gate 837.

The clock divider 831 may generate the division clock signal CLKN by dividing the frequency of the clock signal CLK. A cycle of the division clock signal CLKN may be 2 times of a cycle of the clock signal CLK. A signal B3 output from the output node Q of the second flip-flop 833 may have a phase lagging by a single cycle of the division clock signal CLKN with a signal A3 output through the output node Q of the first flip-flop 832. A signal C3 output from the output node Q of the third flip-flop 834 may have a phase lagging by a single cycle of the division clock signal CLKN with the signal B3 output through the output node Q of the second flip-flop 833. A signal D3 output through the output node Q of the fourth flip-flop 835 may have a phase lagging by a single cycle of the division clock signal CLKN with the signal C3 output through the output node Q of the third flip-flop 834. When any one between the signals A3 and B3 output through the output nodes Q of the first flip-flop 831 and the second flip-flop 832 has a logic high level, the first OR gate 836 may output a signal having a logic high level. When any one between the signals C3 and D3 output through the output nodes Q of the third flip-flop 834 and the fourth flip-flop 835 has a logic high level, the second OR gate 837 may output a signal having a logic high level. The NOR gate 838 may output a signal having a logic low level when any one between the first OR gate 836 and the second OR gate 837 outputs a signal having a logic high level. The first flip-flop 832 may change a logic level of the signal A3, which is output through the first flip-flop 832, to a logic low level in synchronization with a rising edge of the division clock signal CLKN. Therefore, the strobe signal generator 830 may generate a strobe signal having a pulse, which enables for a single cycle of the division clock signal CLKN. Any one among the signals A3, B3, C3 and D3 may be output as the strobe signal.

The strobe generation circuit 520 configured to operate as described with reference to FIG. 5B may include the strobe signal generators 810 and 820 illustrated in FIGS. 8A and 8B. The strobe generation circuit 520 may generate the first falling strobe signal STRF1 by adopting the strobe signal generator 810 illustrated in FIG. 8A and may generate the first rising strobe signal STRR1 by adopting the strobe signal generator 820 illustrated in FIG. 8B. The strobe generation circuit 520 configured to operate as described with reference to FIG. 5C may include the strobe signal generators 810 and 830 illustrated in FIGS. 8A and 8C. The strobe generation circuit 520 may generate the first falling strobe signal STRF1 by adopting the strobe signal generator 810 illustrated in FIG. 8A and may generate the first rising strobe signal STRR1 by adopting the strobe signal generator 830 illustrated in FIG. 8C. The strobe generation circuit 620 configured to operate as described with reference to FIG. 6B may include the strobe signal generator 820 illustrated in FIG. 8B. The strobe generation circuit 620 may generate the second falling strobe signal STRF2 and the second rising strobe signal STRR2 by adopting the strobe signal generator 820 illustrated in FIG. 8B. The strobe generation circuit 620 configured to operate as described with reference to FIG. 6C may include any one among the strobe signal generators 810, 820 and 830 illustrated in FIGS. 8A, 8B and 8C. The strobe generation circuit 620 may generate the second falling strobe signal STRF2 and the second rising strobe signal STRR2 by adopting any one among the strobe signal generators 810, 820 and 830 illustrated in FIGS. 8A, 8B and 8C. The strobe generation circuit 720 configured to operate as described with reference to FIG. 7B may include the strobe signal generators 810 and 820 illustrated in FIGS. 8A and 8B. The strobe generation circuit 720 may generate the third falling strobe signal STRF3 by adopting the strobe signal generator 810 illustrated in FIG. 8A and may generate the third rising strobe signal STRR3 by adopting the strobe signal generator 820 illustrated in FIG. 8B. The strobe generation circuit 720 configured to operate as described with reference to FIG. 7C may include the strobe signal generators 830 and 810 illustrated in FIGS. 8C and 8A. The strobe generation circuit 720 may generate the third falling strobe signal STRF3 by adopting the strobe signal generator 830 illustrated in FIG. 8C and may generate the third rising strobe signal STRR3 by adopting the strobe signal generator 810 illustrated in FIG. 8A.

Figure 9A:
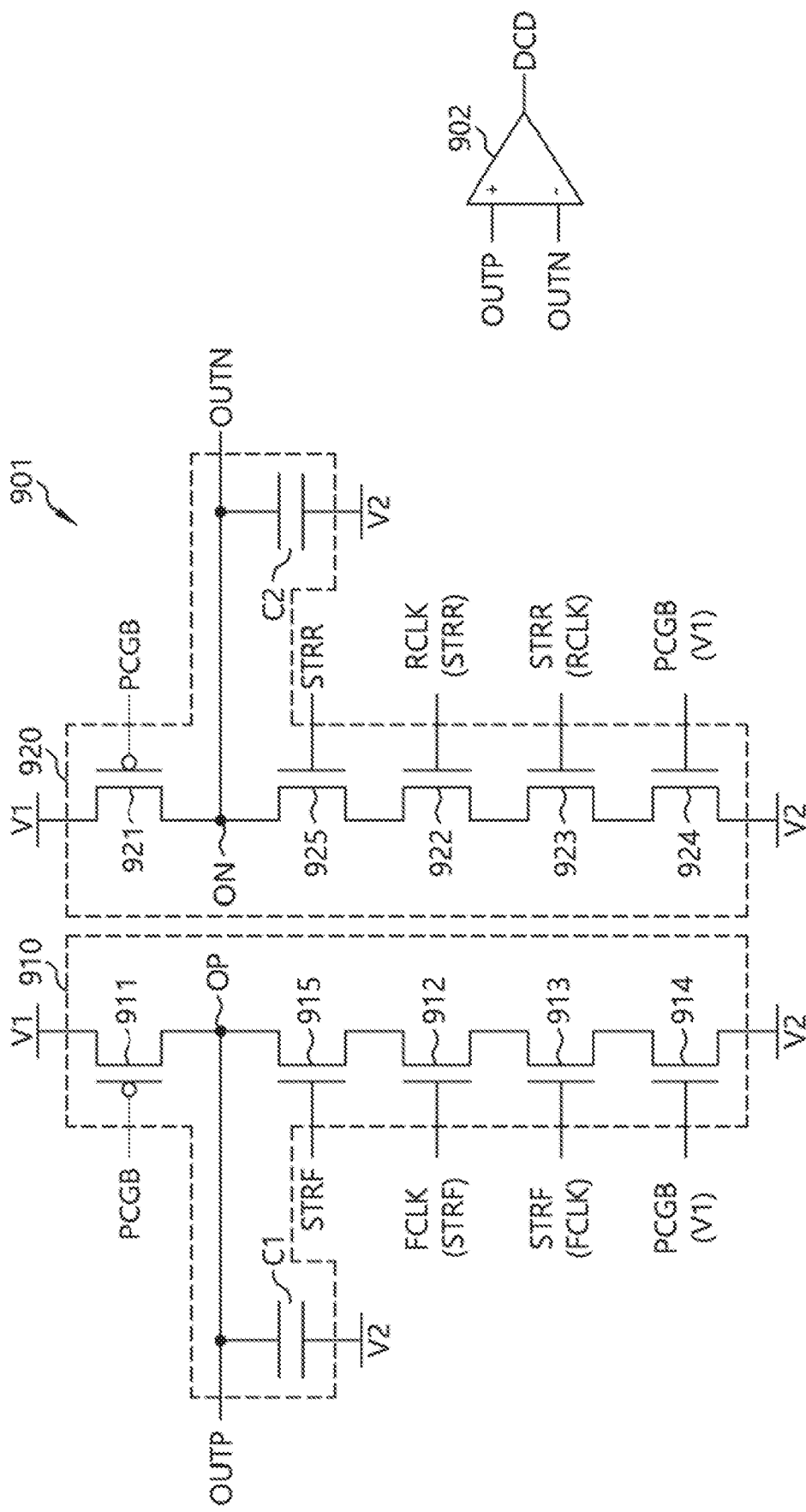

FIG. 9A is a schematic diagram illustrating a configuration of a phase detector 900A in accordance with an embodiment. Referring to FIG. 9A, the phase detector 900A may be applied as the phase detector 430 illustrated in FIG. 4. The phase detector 900A may receive the falling clock signal FCLK, the rising clock signal RCLK, the falling strobe signal STRF and the rising strobe signal STRR. The phase detector 900A may generate a positive output signal OUTP based on the falling clock signal FCLK and the falling strobe signal STRF; and may generate a negative output signal OUTN based on the rising clock signal RCLK and the rising strobe signal STRR. The phase detector 900A may generate the phase detection signal DCD by comparing the voltage levels of the positive output signal OUTP and the negative output signal OUTN.

The phase detector 900A may include a duty detector 901 and a comparator 902. The duty detector 901 may include a first capacitor C1 and a second capacitor C2. The first capacitor C1 may be coupled to a positive output node OP. The positive output signal OUTP may be generated from the positive output node OP. The second capacitor C2 may be coupled to a negative output node ON. The negative output signal OUTN may be generated from the negative output node ON. The duty detector 901 may generate the positive output signal OUTP by detecting the pulse width and/or a high-level period of the falling clock signal FCLK within an enabled period of the falling strobe signal STRF. The duty detector 901 may generate the positive output signal OUTP by discharging the first capacitor C1 based on the pulse of the falling clock signal FCLK within an enabled period of the falling strobe signal STRF. The duty detector 901 may generate the negative output signal OUTN by detecting the pulse width and/or a high-level period of the rising clock signal RCLK within an enabled period of the rising strobe signal STRR. The duty detector 901 may generate the negative output signal OUTN by discharging the second capacitor C2 based on the pulse of the rising clock signal RCLK within an enabled period of the rising strobe signal STRR. Because the high-level period of the falling clock signal FCLK included within the falling strobe signal STRF and the high-level period of the rising clock signal RCLK included within the rising strobe signal STRR are the same with each other, the first capacitor C1 and the second capacitor C2 may have substantially the same capacitance with each other. When the first capacitor C1 and the second capacitor C2 have substantially the same capacitance with each other, the phase detector 900A may be designed to have symmetrical structure. Therefore, the phase detector 900A may perform a precise duty detection operation such that the phases of the plurality of internal clock signals ICLK, QCLK, ICLKB and QCLKB can be precisely adjusted.

Referring to FIG. 4, when the reference clock signal CLKR and the target clock signal CLKT have different duty ratios from each other, a high-level period of the falling clock signal FCLK included within the falling strobe signal STRF and a high-level period of the rising clock signal RCLK included within the rising strobe signal STRR may be different from each other. For example, when the high-level period of the falling clock signal FCLK is longer than the high-level period of the rising clock signal RCLK, the voltage level of the positive output signal OUTP may be lower than the voltage level of the negative output signal OUTN. The comparator 902 may generate the phase detection signal DCD by comparing the voltage levels of the positive output signal OUTP and the negative output signal OUTN. For example, the comparator 902 may output the phase detection signal DCD having a logic low level when the voltage level of the positive output signal OUTP is lower than the voltage level of the negative output signal OUTN. The comparator 902 may output the phase detection signal DCD having a logic high level when the voltage level of the positive output signal OUTP is higher than the voltage level of the negative output signal OUTN.

The duty detector 901 may include a first detection path 910 and a second detection path 920. The first detection path 910 and the second detection path 920 might not be coupled to each other. The duty detector 901 may be realized by an amplification circuit of a single-ended type. The first detection path 910 may include the first capacitor C1, a first transistor 911, a third transistor 912 and a fifth transistor 913. The first transistor 911 may be a P-channel MOS transistor; and each of the third transistor 912 and the fifth transistor 913 may be a N-channel MOS transistor. The first transistor 911 may receive a precharge signal PCGB at its gate; may be coupled to a node, through which a first power voltage V1 is provided, at its source; and may be coupled to the positive output node OP, through which the positive output signal OUTP is provided, at its drain. The third transistor 912 may receive the falling clock signal FCLK at its gate; and may be coupled to the positive output node OP, through which the positive output signal OUTP is provided, at its drain. The fifth transistor 913 may receive the falling strobe signal STRF at its gate; may be coupled to a source of the third transistor 912 at its drain; and may be coupled to a node, through which a second power voltage V2 is provided, at its source. The second power voltage V2 may have a lower voltage level than the first power voltage V1. In an embodiment, the third transistor 912 may be modified to receive the falling strobe signal STRF at its gate; and the fifth transistor 912 may be modified to receive the falling clock signal FCLK at its gate. The first detection path 910 may further include at least one between a seventh transistor 914 and a ninth transistor 915. Each of the seventh transistor 914 and the ninth transistor 915 may be a N-channel MOS transistor. The seventh transistor 914 may receive the precharge signal PCGB at its gate; and may be coupled between a source of the fifth transistor 913 and the node, through which the second power voltage V2 is provided, through its drain and source. The ninth transistor 915 may receive the falling strobe signal STRF at its gate; and may be coupled between a drain of the third transistor 912 and the positive output node OP, through which the positive output signal OUTP is provided, through its drain and source. In an embodiment, the seventh transistor 914 may be modified to receive the first power voltage V1 instead of the precharge signal PCGB.

The second detection path 920 may include the second capacitor C2, a second transistor 921, a fourth transistor 922 and a six transistor 923. The second transistor 921 may be a P-channel MOS transistor; and each of the fourth transistor 922 and the six transistor 923 may be a N-channel MOS transistor. The second transistor 921 may receive a precharge signal PCGB at its gate; may be coupled to the node, through which the first power voltage V1 is provided, at its source; and may be coupled to the negative output node ON, through which the negative output signal OUTN is provided, at its drain. The fourth transistor 922 may receive the rising clock signal RCLK at its gate; and may be coupled to the negative output node ON, through which the negative output signal OUTN is provided, at its drain. The six transistor 923 may receive the rising strobe signal STRR at its gate; may be coupled to a source of the fourth transistor 922 at its drain; and may be coupled to the node, through which the second power voltage V2 is provided, at its source. The second power voltage V2 may have a lower voltage level than the first power voltage V1. In an embodiment, the fourth transistor 922 may be modified to receive the rising strobe signal STRR at its gate; and the six transistor 922 may be modified to receive the rising clock signal RCLK at its gate. The second detection path 920 may further include at least one between an eighth transistor 924 and a tenth transistor 925. Each of the eighth transistor 924 and the tenth transistor 925 may be a N-channel MOS transistor. The eighth transistor 924 may receive the precharge signal PCGB at its gate; and may be coupled between a source of the six transistor 923 and the node, through which the second power voltage V2 is provided, through its drain and source. The tenth transistor 925 may receive the rising strobe signal STRR at its gate; and may be coupled between a drain of the fourth transistor 922 and the negative output node ON, through which the negative output signal OUTN is provided, through its drain and source. In an embodiment, the eighth transistor 924 may be modified to receive the first power voltage V1 instead of the precharge signal PCGB.

When the precharge signal PCGB is enabled to a logic low level, the first transistor 911 and the second transistor 921 may be turned on; and the first power voltage V1 may be provided to the first capacitor C1 and the second capacitor C2 to charge the first 1 and the second capacitor C2. The fifth transistor 913 may be turned on when the falling strobe signal STRF is enabled; and the third transistor 912 may be turned on whenever the pulse of the falling clock signal FCLK occurs. Therefore, during the enabled period of the falling strobe signal STRF, the first detection path 910 may discharge the first capacitor C1 as long as time corresponding to the high-level period of the falling clock signal FCLK. The sixth transistor 923 may be turned on when the rising strobe signal STRR is enabled; and the fourth transistor 922 may be turned on whenever the pulse of the rising clock signal RCLK occurs. Therefore, during the enabled period of the rising strobe signal STRR, the second detection path 920 may discharge the second capacitor C2 as long as time corresponding to the high-level period of the rising clock signal RCLK. When the phase difference between the reference clock signal CLKR and the target clock signal CLKT is greater than or smaller than 90 degrees, 180 degrees or 270 degrees, a length of the high-level period of the falling clock signal FCLK and a length of the high-level period of the rising clock signal RCLK may be different from each other. Therefore, an amount of discharge of the first capacitor C1 and an amount of discharge of the second capacitor C2 may become different from each other; and the voltage levels of the positive output signal OUTP and the negative output signal OUTN become different from each other.

FIG. 9B is a schematic diagram illustrating a configuration of a phase detector 900B in accordance with an embodiment. Referring to FIG. 9B, the phase detector 900B may have substantially the same configuration as the phase detector 900A illustrated in FIG. 9A. The phase detector 900B may be a phase detector of a differential type, which is different from the phase detector 900A. Within the phase detector 900B, sources of the fifth transistor 913 and the sixth transistor 923 may be coupled to each other.

Figure 10A:
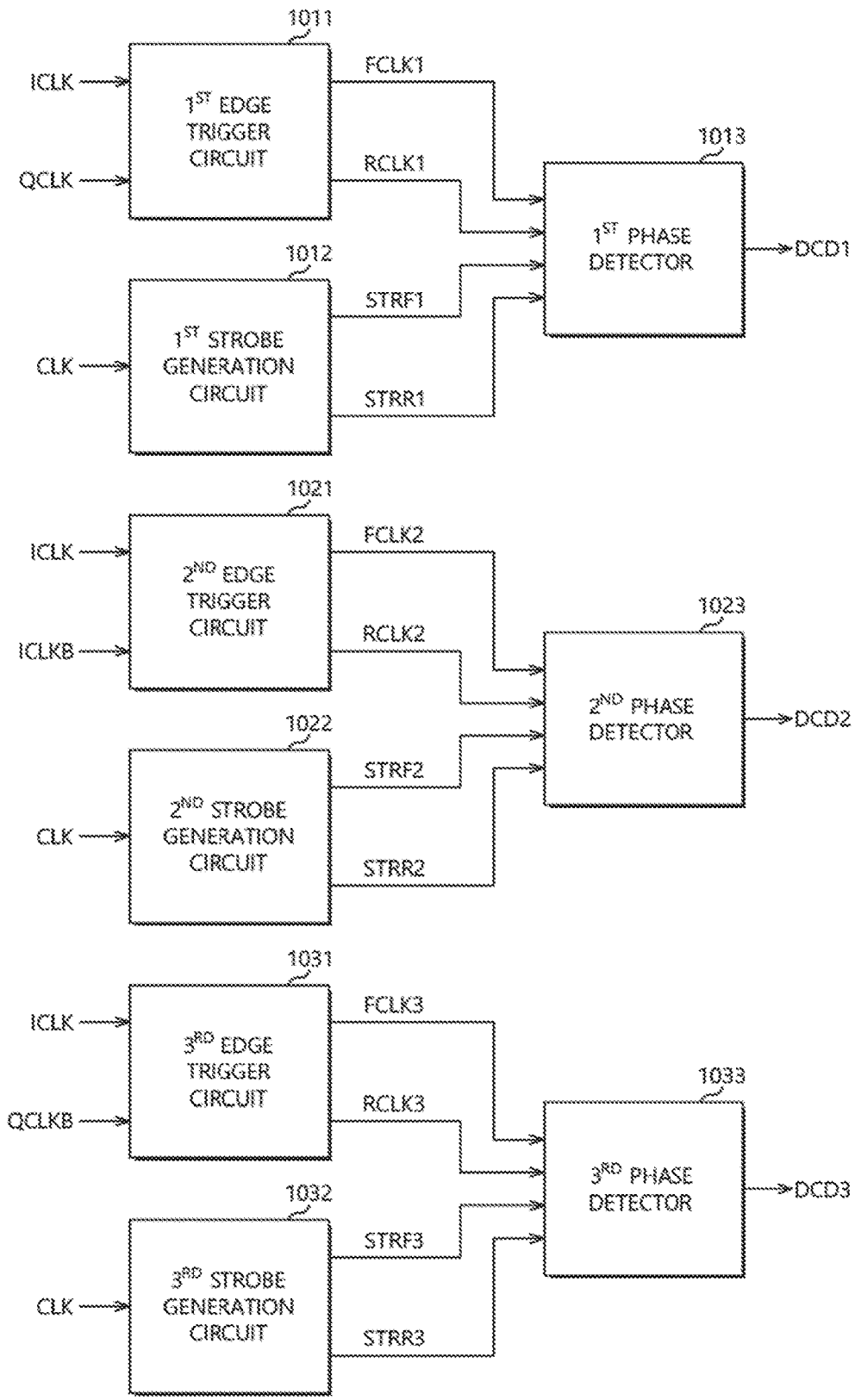
FIGS. 10A and 10B are schematic diagrams illustrating a configuration of a phase detection circuit in accordance with an embodiment.

FIG. 10A is a schematic diagram illustrating a configuration of a phase detection circuit 1000A in accordance with an embodiment. The phase detection circuit 1000A may be applied as the phase detection circuit 310 illustrated in FIG. 3. Referring to FIG. 10A, the phase detection circuit 1000A may include a first edge trigger circuit 1011, a first strobe generation circuit 1012, a first phase detector 1013, a second edge trigger circuit 1021, a second strobe generation circuit 1022, a second phase detector 1023, a third edge trigger circuit 1031, a third strobe generation circuit 1032 and a third phase detector 1033. The first edge trigger circuit 1011 may generate the first falling clock signal FCLK1 and the first rising clock signal RCLK1 based on the first internal clock signal ICLK and the second internal clock signal QCLK. The first strobe generation circuit 1012 may generate the first falling strobe signal STRF1 and the first rising strobe signal STRR1 based on the clock signal CLK. The first phase detector 1013 may generate the first phase detection signal DCD1 based on the first falling clock signal FCLK1, the first rising clock signal RCLK1, the first falling strobe signal STRF1 and the first rising strobe signal STRR1. The edge trigger circuit 510 illustrated in FIG. 5A and configured to operate as illustrated in FIGS. 5B and 5C may be applied as the first edge trigger circuit 1011. The strobe generation circuits 810, 820 and 830 illustrated in FIGS. 8A to 8C may be applied as the first strobe generation circuit 1012. At least one between the phase detectors 900A and 900B illustrated in FIGS. 9A and 9B may be applied as the first phase detector 1013.

The second edge trigger circuit 1021 may generate the second falling clock signal FCLK2 and the second rising clock signal RCLK2 based on the first internal clock signal ICLK and the third internal clock signal ICLKB. The second strobe generation circuit 1022 may generate the second falling strobe signal STRF2 and the second rising strobe signal STRR2 based on the clock signal CLK. The second phase detector 1023 may generate the second phase detection signal DCD2 based on the second falling clock signal FCLK2, the second rising clock signal RCLK2, the second falling strobe signal STRF2 and the second rising strobe signal STRR2. The edge trigger circuit 610 illustrated in FIG. 6A and configured to operate as illustrated in FIGS. 6B and 6C may be applied as the second edge trigger circuit 1021. The strobe generation circuits 810, 820 and 830 illustrated in FIGS. 8A to 8C may be applied as the second strobe generation circuit 1022. At least one between the phase detectors 900A and 900B illustrated in FIGS. 9A and 9B may be applied as the second phase detector 1023.

The third edge trigger circuit 1031 may generate the third falling clock signal FCLK3 and the third rising clock signal RCLK3 based on the first internal clock signal ICLK and the fourth internal clock signal QCLKB. The third strobe generation circuit 1032 may generate the third falling strobe signal STRF3 and the third rising strobe signal STRR3 based on the clock signal CLK. The third phase detector 1033 may generate the third phase detection signal DCD3 based on the third falling clock signal FCLK3, the third rising clock signal RCLK3, the third falling strobe signal STRF3 and the third rising strobe signal STRR3. The edge trigger circuit 710 illustrated in FIG. 7A and configured to operate as illustrated in FIGS. 7B and 7C may be applied as the third edge trigger circuit 1031. The strobe generation circuits 810, 820 and 830 illustrated in FIGS. 8A to 8C may be applied as the third strobe generation circuit 1032. At least one between the phase detectors 900A and 900B illustrated in FIGS. 9A and 9B may be applied as the third phase detector 1033.

The phase detection circuit 1000A may perform a duty correction operation and/or a phase adjustment operation at the same time on the first to fourth internal clock signals ICLK, QCLK, ICLKB and QCLKB. Referring to FIGS. 1 and 10A, when the clock generation circuit 100 receives the clock signal CLK, the phase delay circuit 110 may perform a delay-lock operation on the clock signal CLK. When the phase delay circuit 110 completes the delay-lock operation, the phase detection circuit 1000A may perform a phase detection operation on the second to fourth internal clock signals QCLK, ICLKB and QCLKB with reference to the first internal clock signal ICLK at the same time; and the first to third phase detection signals DCD1, DCD2 and DCD3 may be generated at the same time. Therefore, the phase control circuit 130 and the multi-phase clock output circuit 120 may perform a phase adjustment operation on the second to fourth internal clock signals QCLK, ICLKB and QCLKB at the same time. When the phase adjustment operation is completed, the first to fourth internal clock signals ICLK, QCLK, ICLKB and QCLKB may be utilized by an internal circuit of a semiconductor apparatus including the clock generation circuit 100.

Figure 10B:
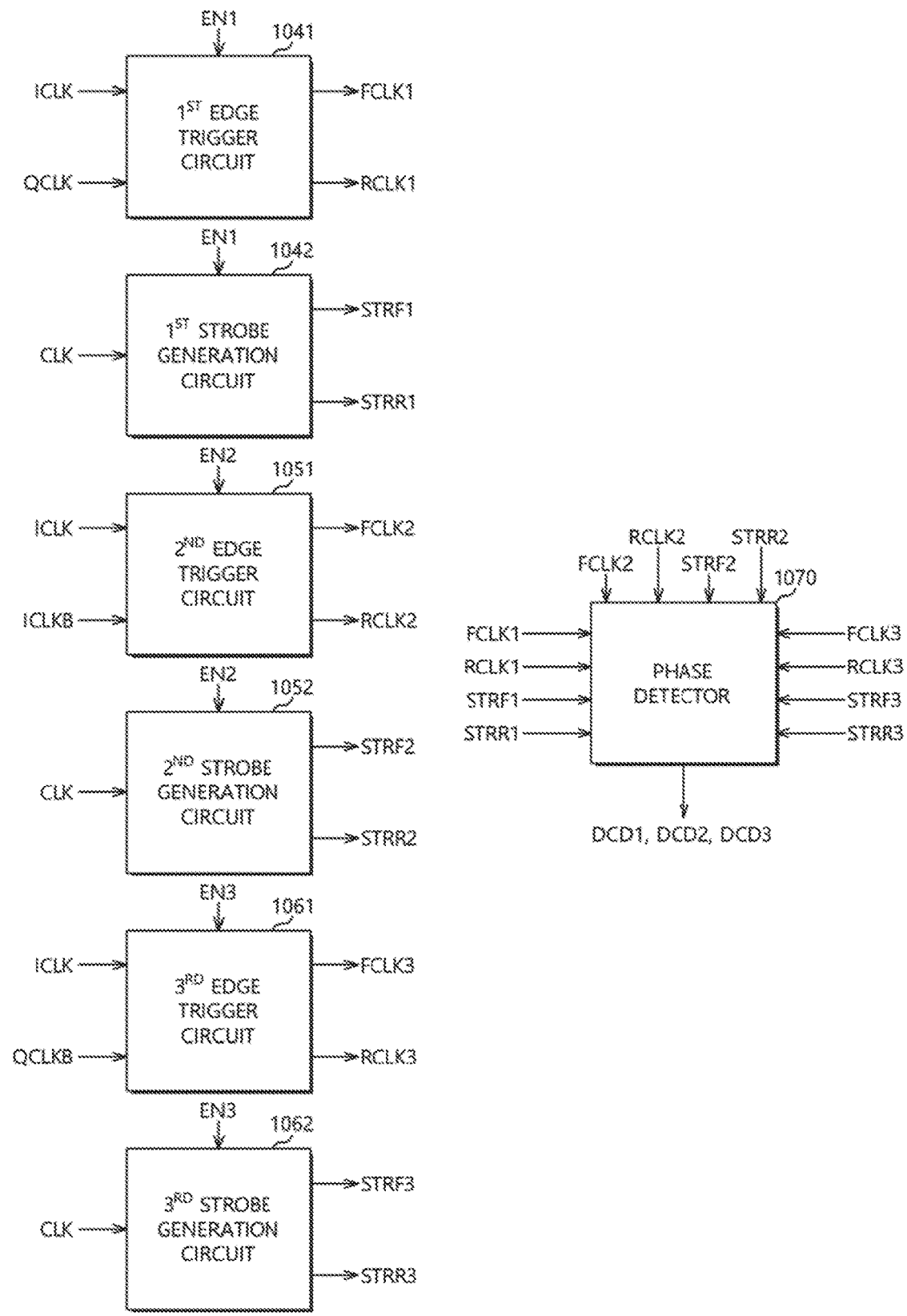

FIG. 10B is a schematic diagram illustrating a configuration of a phase detection circuit 1000B in accordance with an embodiment. The phase detection circuit 1000B may be applied as the phase detection circuit 310 illustrated in FIG. 3. Referring to FIG. 10B, the phase detection circuit 1000B may include a first edge trigger circuit 1041, a first strobe generation circuit 1042, a second edge trigger circuit 1051, a second strobe generation circuit 1052, a third edge trigger circuit 1061, a third strobe generation circuit 1062 and a single phase detector 1070. The first edge trigger circuit 1041 and the first strobe generation circuit 1042 may have the same configuration as the first edge trigger circuit 1011 and the first strobe generation circuit 1012 illustrated in FIG. 10A except that the first edge trigger circuit 1041 and the first strobe generation circuit 1042 further receive a first enable signal EN1. The second edge trigger circuit 1051 and the second strobe generation circuit 1052 may have the same configuration as the second edge trigger circuit 1021 and the second strobe generation circuit 1022 illustrated in FIG. 10A except that the second edge trigger circuit 1051 and the second strobe generation circuit 1052 further receive a second enable signal EN2. The third edge trigger circuit 1061 and the third strobe generation circuit 1062 may have the same configuration as the third edge trigger circuit 1031 and the third strobe generation circuit 1032 illustrated in FIG. 10A except that the third edge trigger circuit 1061 and the third strobe generation circuit 1062 further receive a third enable signal EN3.

The first to third enable signals EN1, EN2 and EN3 may be sequentially enabled. For example, the first enable signal EN1 may be enabled when the phase delay circuit 110 of the clock generation circuit 100 completes a delay-lock operation. The second enable signal EN2 may be enabled when a phase adjustment operation on the second internal clock signal QCLK with reference to the first internal clock signal ICLK is completed. The third enable signal EN3 may be enabled when a phase adjustment operation on the third internal clock signal ICLKB with reference to the first internal clock signal ICLK is completed. The first to third edge trigger circuits 1041, 1042 and 1043 and the first to third strobe generation circuits 1042, 1052 and 1062 may be sequentially operate based on the first to third enable signals EN1, EN2 and EN3, respectively. Therefore, the phase detection circuit 1000B may include the single phase detector 1070. The phase detector 1070 may generate the first phase detection signal DCD1 based on the first falling clock signal FCLK1, the first rising clock signal RCLK1, the first falling strobe signal STRF1 and the first rising strobe signal STRR1. The phase detector 1070 may generate the second phase detection signal DCD2 based on the second falling clock signal FCLK2, the second rising clock signal RCLK2, the second falling strobe signal STRF2 and the second rising strobe signal STRR2. The phase detector 1070 may generate the third phase detection signal DCD3 based on the third falling clock signal FCLK3, the third rising clock signal RCLK3, the third falling strobe signal STRF3 and the third rising strobe signal STRR3.

The clock generation circuit 100 may include the phase detection circuit 1000B and may perform a duty correction operation and/or a phase adjustment operation sequentially on the first to fourth internal clock signals ICLK, QCLK, ICLKB and QCLKB. When the clock generation circuit 100 receives the clock signal CLK, the phase delay circuit 110 may perform a delay-lock operation on the clock signal CLK. When the phase delay circuit 110 completes the delay-lock operation, the first enable signal EN1 may be enabled; the phase detection circuit 1000B may perform a phase detection operation on the second internal clock signal QCLK with reference to the first internal clock signal ICLK; and the multi-phase clock output circuit 120 and the phase control circuit 130 may perform a phase adjustment operation on the second internal clock signal QCLK. When the phase adjustment operation on the second internal clock signal QCLK is completed, the second enable signal EN2 may be enabled; the phase detection circuit 1000B may perform a phase detection operation on the third internal clock signal ICLKB with reference to the first internal clock signal ICLK; and the multi-phase clock output circuit 120 and the phase control circuit 130 may perform a phase adjustment operation on the third internal clock signal ICLKB. When the phase adjustment operation on the third internal clock signal ICLKB is completed, the third enable signal EN3 may be enabled; the phase detection circuit 1000B may perform a phase detection operation on the fourth internal clock signal QCLKB with reference to the first internal clock signal ICLK; and the multi-phase clock output circuit 120 and the phase control circuit 130 may perform a phase adjustment operation on the fourth internal clock signal QCLKB. When the phase adjustment operation on the fourth internal clock signal QCLKB is completed, the first to fourth internal clock signals ICLK, QCLK, ICLKB and QCLKB may be utilized by an internal circuit of a semiconductor apparatus including the clock generation circuit 100.

Figure 11:
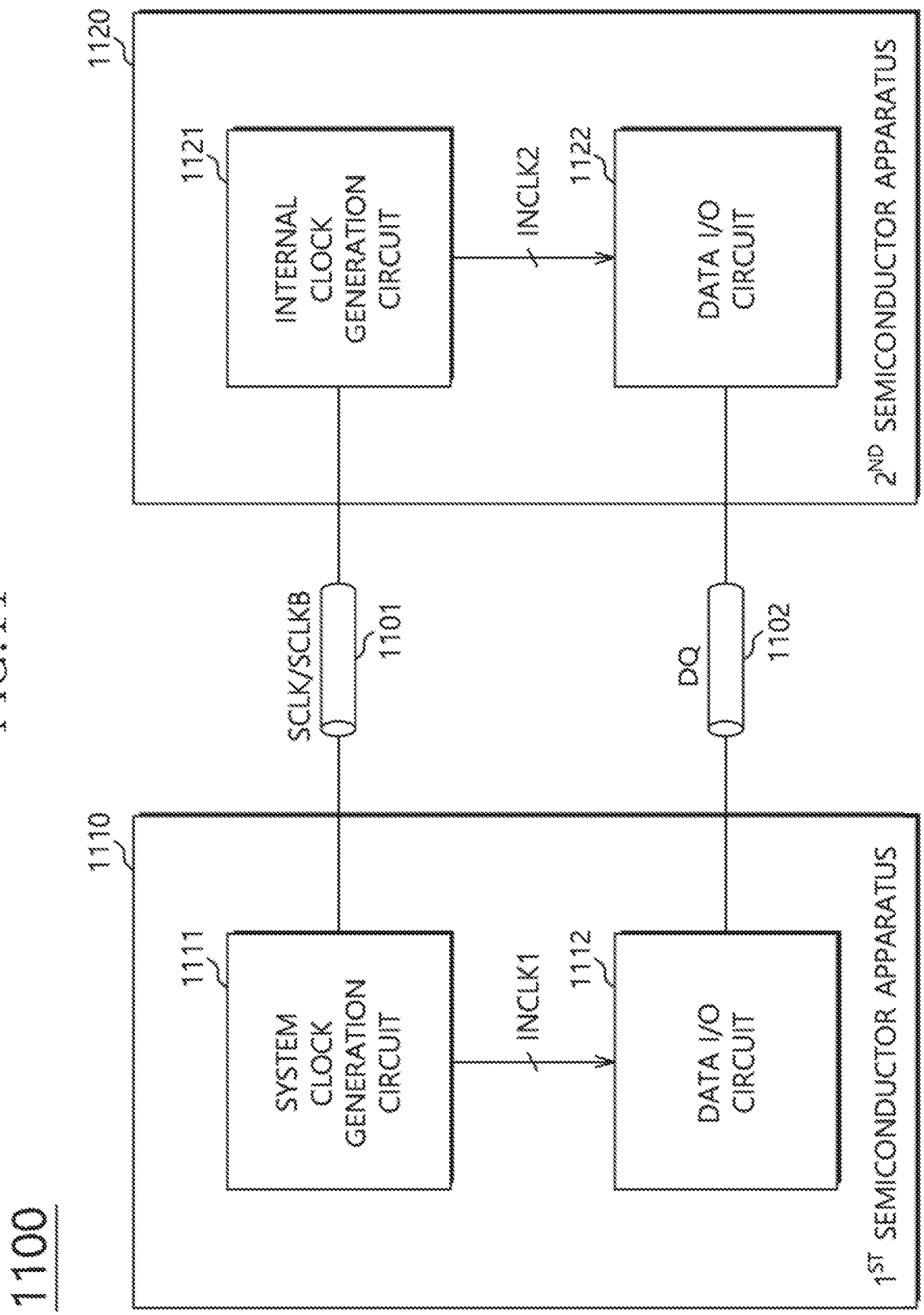
FIG. 11 is a schematic diagram illustrating a configuration of a semiconductor system in accordance with an embodiment.

FIG. 11 is a schematic diagram illustrating a configuration of a semiconductor system 1100 in accordance with an embodiment. Referring to FIG. 11, the semiconductor system 1100 may include a first semiconductor apparatus 1110 and a second semiconductor apparatus 1120. The first semiconductor apparatus 1110 may provide various control signals used for the second semiconductor apparatus 1120 to operate. The first semiconductor apparatus 1110 may include various types of devices. For example, the first semiconductor apparatus 1110 may be a host device such as a central processing unit (CPU), a graphic processing unit (GPU), a multi-media processor (MMP), a digital signal processor, an application processor (AP) and a memory controller. For example, the second semiconductor apparatus 1120 may be a memory device and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 1120 may be coupled to the first semiconductor apparatus 1110 through a plurality of buses. The plurality of buses may be a signal transmission path, a link or a channel for transferring a signal. The plurality of buses may include a clock bus 1101 and a data bus 1102. The clock bus 1101 may be a one-way bus and the data bus 1102 may be a two-way bus. Although not illustrated, the semiconductor system 1100 may further include a command bus and an address bus configured to transfer a command signal and an address signal from the first semiconductor apparatus 1110 to the second semiconductor apparatus 1120. The second semiconductor apparatus 1120 may be coupled to the first semiconductor apparatus 1110 through the clock bus 1101 and may receive a system clock signal SCLK from the first semiconductor apparatus 1110 through the clock bus 1101. The system clock signal SCLK may be transmitted as a single ended signal and may be transmitted, as a differential signal, together with a complementary system clock signal SCLKB. The second semiconductor apparatus 1120 may be coupled to the first semiconductor apparatus 1110 through the data bus 1102 and may receive data DQ from the first semiconductor apparatus 1110 and transmit data DQ to the first semiconductor apparatus 1110 through the data bus 1102.

The first semiconductor apparatus 1110 may include a system clock generation circuit 1111 and a data input/output circuit 1112. The system clock generation circuit 1111 may generate the system clock signal SCLK. The system clock generation circuit 1111 may provide the second semiconductor apparatus 1120 with the system clock signal SCLK through the clock bus 1101. The system clock generation circuit 1111 may generate and transmit the complementary system clock signal SCLKB together with the system clock signal SCLK. The system clock generation circuit 1111 may include a clock generation circuit such as a phase-locked loop circuit. The system clock generation circuit 1111 may generate a plurality of first internal clock signals INCLK1 sequentially having constant phase differences from the system clock signal SCLK. The clock generation circuit 100 illustrated in FIG. 1 may be applied as the system clock generation circuit 1111. The data input/output circuit 1112 may receive the plurality of first internal clock signals INCLK1 from the system clock generation circuit 1111. The data input/output circuit 1112 may be coupled to the data bus 1102, may transmit the data DQ through the data bus 1102 and may receive the data DQ provided through the data bus 1102. The data input/output circuit 1112 may transmit the data DQ to the second semiconductor apparatus 1120 in synchronization with the plurality of first internal clock signals INCLK1 and may receive the data DQ transmitted from the second semiconductor apparatus 1120 in synchronization with the plurality of first internal clock signals INCLK1.

The second semiconductor apparatus 1120 may include an internal clock generation circuit 1121 and a data input/output circuit 1122. The internal clock generation circuit 1121 may be coupled to the clock bus 1101 and may receive the system clock signal SCLK and the complementary system clock signal SCLKB transferred through the clock bus 1101. The internal clock generation circuit 1121 may include a delay-locked loop circuit configured to generate a delay clock signal CLKD by delaying the system clock signal SCLK. The internal clock generation circuit 1121 may generate a plurality of second internal clock signals INCLK2 sequentially having constant phase differences from the delay clock signal CLKD. The clock generation circuit 100 illustrated in FIG. 1 may be applied as the internal clock generation circuit 1121. The data input/output circuit 1122 may receive the plurality of second internal clock signals INCLK2 from the internal clock generation circuit 1121. The data input/output circuit 1122 may be coupled to the data bus 1102, may transmit the data DQ through the data bus 1102 and may receive the data DQ provided through the data bus 1102. The data input/output circuit 1122 may transmit the data DQ to the first semiconductor apparatus 1110 in synchronization with the plurality of second internal clock signals INCLK2 and may receive the data DQ transmitted from the first semiconductor apparatus 1110 in synchronization with the plurality of second internal clock signals INCLK2.

While certain embodiments have been described above, it will be understood to those skilled in the art that the embodiments described are by way of example only. Accordingly, the phase detection circuits, clock generation circuits and semiconductor apparatuses using the same should not be limited based on the described embodiments. Rather, the phase detection circuits, clock generation circuits and semiconductor apparatuses using the same described herein should only be limited in light of the claims that follow when taken in conjunction with the above description and accompanying drawings.

What is claimed is:

1. A phase detection circuit comprising:
   an edge trigger circuit configured to generate a falling clock signal and a rising clock signal by triggering edges of a reference clock signal and a target clock signal;
   a strobe generation circuit configured to generate a falling strobe signal having a pulse which enables for a first amount of time, and generate a rising strobe signal having a pulse which enables for a second amount of time, the first amount of time being set based on which edges of the reference clock signal and the target clock signal are triggered for generating the falling clock signal and the second amount of time being set based on which edges of the reference clock signal and the target clock signal are triggered for generating the rising clock signal; and
   a phase detector configured to generate a phase detection signal based on the falling clock signal, the rising clock signal, the falling strobe signal and the rising strobe signal.

2. The phase detection circuit of claim 1, wherein the first and second amounts of time are set such that a length of a high-level period of the falling clock signal included within the falling strobe signal is the same as a length of a high-level period of the rising clock signal included within the rising strobe signal.

3. The phase detection circuit of claim 2, wherein the first amount of time is longer than the second amount of time.

4. The phase detection circuit of claim 2, wherein the first amount of time corresponds to 'm' times of a cycle of the reference clock signal; and the second amount of time corresponds to '2m' times of a cycle of the reference clock signal, 'cm' being a multiple of 2.

5. The phase detection circuit of claim 1,
   wherein the target clock signal has a phase lagging by an 90 degrees with the reference clock signal, and
   wherein the edge trigger circuit generates:
   the falling clock signal having a pulse which enables during a period from a rising edge of the reference clock signal to a subsequent rising edge of the reference clock signal, and
   the rising clock signal having a pulse, which enables during a period from a rising edge of the target clock signal to a rising edge of the reference clock signal.

6. The phase detection circuit of claim 1,
   wherein the target clock signal has a phase lagging by 180 degrees with the reference clock signal, and
   wherein the edge trigger circuit generates:
   the falling clock signal having a pulse, which enables during a period from a rising edge of the reference clock signal to a subsequent rising edge of the reference clock signal, and
   the rising clock signal having a pulse, which enables during a period from a rising edge of the reference clock signal to a rising edge of the target clock signal.

7. The phase detection circuit of claim 6, wherein the first amount of time is the same as the second amount of time.

8. The phase detection circuit of claim 6, wherein each of the first and second amounts of time corresponds to 'cm' times of a cycle of the reference clock signal, 'cm' being a multiple of 2.

9. The phase detection circuit of claim 1,
   wherein the target clock signal has a phase lagging by 270 degrees with the reference clock signal, and
   wherein the edge trigger circuit generates:
   the falling clock signal having a pulse, which enables during a period from a rising edge of the reference clock signal to a subsequent rising edge of the reference clock signal, and
   the rising clock signal having a pulse, which enables during a period from a rising edge of the reference clock signal to a rising edge of the target clock signal.

10. The phase detection circuit of claim 9, wherein the first amount of time is longer than the second amount of time.

11. The phase detection circuit of claim 9, wherein the first amount of time corresponds to '3m' times of a cycle of the reference clock signal; and the second amount of time corresponds to '2m' times of the cycle of the reference clock signal, 'cm' being a multiple of 2.

12. The phase detection circuit of claim 1, wherein the edge trigger circuit generates:
   the falling clock signal having a pulse, which enables during a period from a rising edge of the reference clock signal to a rising edge of the target clock signal, and
   the rising clock signal having a pulse, which enables during a period from a rising edge of the target clock signal to a rising edge of the reference clock signal.

13. The phase detection circuit of claim 12, wherein the first amount of time is longer than the second amount of time when the target clock signal has a phase lagging by 90 degrees with the reference clock signal.

14. The phase detection circuit of claim 12, wherein the first amount of time corresponds to '3k' times of a cycle of the reference clock signal; and the second amount of time corresponds to 'ck' times of the cycle of the reference clock signal, 'ck' being an integer equal to or greater than 1, when the target clock signal has a phase lagging by 90 degrees with the reference clock signal.

15. The phase detection circuit of claim 12, wherein the first amount of time is the same as the second amount of time when the target clock signal has a phase lagging by 180 degrees with the reference clock signal.

16. The phase detection circuit of claim 12, wherein each of the first and second amounts of time corresponds to 'ck' times of a cycle of the reference clock signal, 'ck' being an integer equal to or greater than 1, when the target clock signal has a phase lagging by 180 degrees with the reference clock signal.

17. The phase detection circuit of claim 12, wherein the first amount of time is less than the second amount of time when the target clock signal has a phase lagging by 270 degrees with the reference clock signal.

18. The phase detection circuit of claim 12, wherein the first amount of time corresponds to 'ck' times of a cycle of the reference clock signal; and the second amount of time corresponds to '3k' times of the cycle of the reference clock signal, 'ck' being an integer equal to or greater than 1, when the target clock signal has a phase lagging by 270 degrees with the reference clock signal.

19. The phase detection circuit of claim 1, wherein the phase detector generates the phase detection signal by detecting pulses of the falling clock signal within an enabled period of the falling strobe signal and pulses of the rising clock signal within an enabled period of the rising strobe signal.

20. The phase detection circuit of claim 1, wherein the phase detector includes:
a duty detector configured to generate a positive output signal based on the falling clock signal and the falling strobe signal and generate a negative output signal based on the rising clock signal and the rising strobe signal; and
a comparator configured to generate the phase detection signal by comparing the positive output signal with the negative output signal.

21. The phase detection circuit of claim 20, wherein the duty detector includes:
a first capacitor coupled to a positive output node; and
a second capacitor coupled to a negative output node,
wherein the duty detector outputs the positive output signal through the positive output node by discharging the positive output node based on the falling clock signal and the falling strobe signal; and outputs the negative output signal through the negative output node by discharging the negative output node based on the rising clock signal and the rising strobe signal, and
wherein the first and second capacitors have substantially the same capacitance with each other.

22. The phase detection circuit of claim 20,
wherein the duty detector generates the positive output signal by detecting a pulse width of the falling clock signal within an enable period of the falling strobe signal, and
wherein the duty detector generates the negative output signal by detecting a pulse width of the rising clock signal within an enable period of the rising strobe signal.

23. A phase detection circuit comprising:
an edge trigger circuit configured to generate a falling clock signal and a rising clock signal by triggering edges of a reference clock signal and a target clock signal;
a strobe generation circuit configured to generate a falling strobe signal having a pulse width varying based on a pulse width of the falling clock signal within a single cycle of the falling clock signal and to generate a rising strobe signal having a pulse width varying based on a pulse width of the rising clock signal within a single cycle of the rising clock signal; and
a phase detector configured to generate a positive output signal based on the falling clock signal and the falling strobe signal; generate a negative output signal based on the rising clock signal and the rising strobe signal; and generate a phase detection signal by comparing the positive output signal with the negative output signal.

24. The phase detection circuit of claim 23, wherein the edge trigger circuit generates:
the falling clock signal having a pulse, which enables during a period from a rising edge of the reference clock signal to a subsequent rising edge of the reference clock signal,
the rising clock signal having a pulse, which enables during a period from a rising edge of the target clock signal to a rising edge of the reference clock signal when the target clock signal has a phase lagging by 90 degrees with the reference clock signal, and
the rising clock signal having a pulse, which enables during a period from a rising edge of the reference clock signal to a rising edge of the target clock signal when the target clock signal has a phase lagging by 180 degrees or 270 degrees with the reference clock signal.

25. The phase detection circuit of claim 24,
wherein the strobe generation circuit generates, when the target clock signal has a phase lagging by 90 degrees or 270 degrees with the reference clock signal, the falling strobe signal, which enables for a longer time than the rising strobe signal, and
wherein the strobe generation circuit generates, when the target clock signal has a phase lagging by 180 degrees with the reference clock signal, the falling strobe signal and the rising strobe signal, which enable for the same time with each other.

26. The phase detection circuit of claim 23, wherein the edge trigger circuit generates:
the falling clock signal having a pulse, which enables during a period from a rising edge of the reference clock signal to a rising edge of the target clock signal, and
the rising clock signal having a pulse, which enables during a period from a rising edge of the target clock signal to a rising edge of the reference clock signal.

27. The phase detection circuit of claim 26,
wherein the strobe generation circuit generates, when the target clock signal has a phase lagging by 90 degrees with the reference clock signal, the falling strobe signal, which enables for a longer time than the rising strobe signal,
wherein the strobe generation circuit generates, when the target clock signal has a phase lagging by 180 degrees with the reference clock signal, the falling strobe signal and the rising strobe signal, which enable for the same time with each other, and
wherein the strobe generation circuit generates, when the target clock signal has a phase lagging by 270 degrees with the reference clock signal, the rising strobe signal, which enables for a longer time than the falling strobe signal.

28. The phase detection circuit of claim 23, wherein the phase detector generates the positive output signal by detecting a high-level period of the falling clock signal within an enabled period of the falling strobe signal; generate the negative output signal by detecting a high-level period of the rising clock signal within an enabled period of the rising strobe signal; and generate the phase detection signal by comparing the positive output signal with the negative output signal.

29. The phase detection circuit of claim 23, wherein the phase detector includes:
   a duty detector configured to generate the positive output signal based on the falling clock signal and the falling strobe signal and generate the negative output signal based on the rising clock signal and the rising strobe signal; and
   a comparator configured to generate the phase detection signal by comparing the positive output signal with the negative output signal.

30. The phase detection circuit of claim 29, wherein the duty detector includes:
   a first capacitor coupled to a positive output node; and
   a second capacitor coupled to a negative output node,
   wherein the duty detector outputs the positive output signal through the positive output node by discharging the positive output node based on the falling clock signal and the falling strobe signal; and outputs the negative output signal through the negative output node by discharging the negative output node based on the rising clock signal and the rising strobe signal, and
   wherein the first and second capacitors have the same capacitance with each other.

* * * * *

UNITED STATES PATENT AND TRADEMARK OFFICE
CERTIFICATE OF CORRECTION

PATENT NO.         : 11,513,553 B2
APPLICATION NO.    : 16/705512
DATED              : November 29, 2022
INVENTOR(S)        : Gyu Tae Park Page 1 of 2

It is certified that error appears in the above-identified patent and that said Letters Patent is hereby corrected as shown below:

In the Claims

Claim 4, Please replace "4. The phase detection circuit of claim 2, wherein the first amount of time corresponds to '3m' times of a cycle of the reference clock signal; and the second amount of time corresponds to '2m' times of a cycle of the reference clock signal, 'cm' being a multiple of 2." with --4. The phase detection circuit of claim 2, wherein the first amount of time corresponds to '3m' times of a cycle of the reference clock signal; and the second amount of time corresponds to '2m' times of a cycle of the reference clock signal, 'm' being a multiple of 2.--

Claim 8, Please replace "8. The phase detection circuit of claim 6, wherein each of the first and second amounts of time corresponds to 'cm' times of a cycle of the reference clock signal, 'cm' being a multiple of 2." with --8. The phase detection circuit of claim 6, wherein each of the first and second amounts of time corresponds to 'm' times of a cycle of the reference clock signal, 'm' being a multiple of 2.--

Claim 11, Please replace "11. The phase detection circuit of claim 9, wherein the first amount of time corresponds to '3m' times of a cycle of the reference clock signal; and the second amount of time corresponds to '2m' times of the cycle of the reference clock signal, 'cm' being a multiple of 2." with --11. The phase detection circuit of claim 9, wherein the first amount of time corresponds to '3m' times of a cycle of the reference clock signal; and the second amount of time corresponds to '2m' times of the cycle of the reference clock signal, 'm' being a multiple of 2.--

Claim 14, Please replace "14. The phase detection circuit of claim 12, wherein the first amount of time corresponds to '3k' times of a cycle of the reference clock signal; and the second amount of time corresponds to 'ck' times of the cycle of the reference clock signal, 'ck' being an integer equal to or greater than 1, when the target clock signal has a phase lagging by 90 degrees with the reference clock signal." with --14. The phase detection circuit of claim 12, wherein the first amount of time corresponds to '3k' times of a cycle of the reference clock signal; and the second amount of time corresponds to 'k' times of the cycle of the reference clock signal, 'k' being an integer equal to or Signed and Sealed this
Seventh Day of March, 2023

Katherine Kelly Vidal
*Director of the United States Patent and Trademark Office* greater than 1, when the target clock signal has a phase lagging by 90 degrees with the reference clock signal.--

Claim 16, Please replace "16. The phase detection circuit of claim 12, wherein each of the first and second amounts of time corresponds to 'ck' times of a cycle of the reference clock signal, 'ck' being an integer equal to or greater than 1, when the target clock signal has a phase lagging by 180 degrees with the reference clock signal." with --16. The phase detection circuit of claim 12, wherein each of the first and second amounts of time corresponds to 'k' times of a cycle of the reference clock signal, 'k' being an integer equal to or greater than 1, when the target clock signal has a phase lagging by 180 degrees with the reference clock signal.--

Claim 18, Please replace "18. The phase detection circuit of claim 12, wherein the first amount of time corresponds to 'ck' times of a cycle of the reference clock signal; and the second amount of time corresponds to '3k' times of the cycle of the reference clock signal, 'ck' being an integer equal to or greater than 1, when the target clock signal has a phase lagging by 270 degrees with the reference clock signal." with --18. The phase detection circuit of claim 12, wherein the first amount of time corresponds to 'k' times of a cycle of the reference clock signal; and the second amount of time corresponds to '3k' times of the cycle of the reference clock signal, 'k' being an integer equal to or greater than 1, when the target clock signal has a phase lagging by 270 degrees with the reference clock signal.--